(12) United States Patent
King

(10) Patent No.: US 11,915,345 B2
(45) Date of Patent: Feb. 27, 2024

(54) CUBE MAPPING USING GRADIENTS OF AN INPUT BLOCK OF FRAGMENTS

(71) Applicant: Imagination Technologies Limited, Kings Langley (GB)

(72) Inventor: Rostam King, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 17/883,466

(22) Filed: Aug. 8, 2022

(65) Prior Publication Data

US 2023/0085561 A1    Mar. 16, 2023

(30) Foreign Application Priority Data

Aug. 6, 2021 (GB) .................................... 2111403

(51) Int. Cl.
| | | |
|---|---|---|
| *G06T 11/00* | (2006.01) | |
| *G06F 30/31* | (2020.01) | |
| *G06F 30/392* | (2020.01) | |
| *G06T 1/20* | (2006.01) | |

(52) U.S. Cl.
CPC ............ *G06T 11/001* (2013.01); *G06F 30/31* (2020.01); *G06F 30/392* (2020.01); *G06T 1/20* (2013.01)

(58) Field of Classification Search
CPC ......... G06F 30/392; G06F 30/31; G06T 1/20; G06T 11/001; G06T 15/005; G06T 15/04
See application file for complete search history.

(56) References Cited

U.S. PATENT DOCUMENTS

| | | | |
|---|---|---|---|
| 6,333,743 B1 | 12/2001 | Gossett et al. | |
| 7,136,071 B1* | 11/2006 | Donovan | ................ G06T 15/04 345/428 |
| 7,324,113 B1 | 1/2008 | Rouet et al. | |
| 8,803,879 B1* | 8/2014 | Newhall, Jr. | ........... G06T 15/60 345/620 |
| 8,817,025 B1* | 8/2014 | Urbach | .............. H04N 21/2393 345/419 |
| 2003/0169265 A1 | 9/2003 | Emberling | |
| 2006/0268005 A1 | 11/2006 | Hutchins et al. | |
| 2018/0174352 A1 | 6/2018 | Kang | |
| 2018/0190007 A1* | 7/2018 | Panteleev | ............ H04N 13/257 |

FOREIGN PATENT DOCUMENTS

| | | |
|---|---|---|
| EP | 3125199 A1 | 2/2017 |
| EP | 3340183 A1 | 6/2018 |
| EP | 3675058 A1 | 7/2020 |

* cited by examiner

*Primary Examiner* — Phi Hoang
(74) *Attorney, Agent, or Firm* — Potomac Law Group, PLLC; Vincent M DeLuca

(57) ABSTRACT

Methods and hardware for cube mapping comprise receiving fragment coordinates for an input block of fragments and texture instructions for the fragments and then determining, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision. Cube mapping is then performed using the determined mode and the gradients, wherein if the second mode is used and more than half of the fragments in the input block are valid, the cube mapping is performed over two clock cycles.

20 Claims, 10 Drawing Sheets

CUBE MAPPING USING GRADIENTS OF AN INPUT BLOCK OF FRAGMENTS

BACKGROUND

Graphics processing typically involves performing huge numbers of computations to ultimately define the properties of each pixel that is rendered. Fragment shaders (also known as pixel shaders) may be used to compute these properties (e.g. colour and other attributes) where the term 'fragment' may be used to refer to an element of a primitive at a sample position and there may be a 1:1 correspondence between sample positions and pixel positions in the final rendered image. The properties of an output pixel may be dependent upon a plurality of texels from a source texture and so computing the properties of an output pixel involves determining the texture addresses for these texels.

The embodiments described below are provided by way of example only and are not limiting of implementations which solve any or all of the disadvantages of known graphics processing systems and in particular, known methods of texture address generation.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods and hardware for texture address generation are described. The method comprises receiving fragment coordinates for an input block of fragments and texture instructions for the fragments and calculating gradients for at least one pair of fragments. Based on the gradients, the method determines whether a first mode or a second mode of texture address generation is to be used and then uses the determined mode and the gradients to perform texture address generation. The first mode of texture address generation performs calculations at a first precision for a subset of the fragments and calculations for remaining fragments at a second, lower, precision. The second mode of texture address generation performs calculations for all fragments at the first precision and if the second mode is used and more than half of the fragments in the input block are valid, the texture address generation is performed over two clock cycles.

Methods and hardware for cube mapping are described. The method comprises receiving fragment coordinates for an input block of fragments and texture instructions for the fragments and then determining, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision. Cube mapping is then performed using the determined mode and the gradients, wherein if the second mode is used and more than half of the fragments in the input block are valid, the cube mapping is performed over two clock cycles.

A first aspect provides a method of texture address generation, the method comprising: receiving fragment coordinates for an input block of fragments and texture instructions for the fragments; calculating gradients for at least one pair of fragments from the input block and determining, based on the calculated gradients, whether a first mode of texture address generation or a second mode of texture address generation is to be used, wherein the first mode of texture address generation performs calculations at a first precision for a subset of the fragments and calculations for remaining fragments at a second, lower, precision and the second mode of texture address generation performs calculations for all fragments at the first precision; and using the determined mode and the calculated gradients to perform texture address generation, wherein if the second mode is used and more than half of the fragments in the input block are valid, the texture address generation is performed over two clock cycles.

A second aspect provides a texture address generation unit comprising: an input for receiving fragment coordinates for an input block of fragments and texture instructions for the fragments; an analysis hardware logic block arranged to calculate gradients for at least one pair of fragments from the input block of fragments and determine, based on the calculated gradients, whether a first mode of texture address generation or a second mode of texture address generation is to be used, wherein the first mode of texture address generation performs calculations at a first precision for a subset of the fragments and calculations for remaining fragments at a second, lower, precision and the second mode of texture address generation performs calculations for all fragments at the first precision; and at least one further hardware logic block arranged to use the determined mode and the calculated gradients to perform texture address generation, wherein if the second mode is used and more than half of the fragments in the input block are valid, the texture address generation is performed over two clock cycles.

A third aspect provides a method of cube mapping, the method comprising: receiving fragment coordinates for an input block of fragments and texture instructions for the fragments; determining, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision; and using the determined mode and the gradients to perform cube mapping, wherein if the second mode is used and more than half of the fragments in the input block are valid, the cube mapping is performed over two clock cycles.

A fourth aspect provides cube mapping hardware logic unit comprising: an input for receiving fragment coordinates for an input block of fragments and texture instructions for the fragments; an analysis hardware logic block arranged to determine, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision; and one or more further hardware logic blocks arranged to perform cube mapping using the determined mode and the gradients, wherein if the second mode is used and more than half of the fragments in the input block are valid, the cube mapping is performed over two clock cycles.

Further aspects provide a texture address generation unit comprising a cube mapping hardware logic as described herein; texture hardware comprising a texture address generation unit as described herein; a rendering unit comprising texture hardware or a texture address generation unit as described herein; a graphics processing system comprising a rendering unit as described herein; a graphics processing system configured to perform any of the methods described herein (where the graphics processing system may be embodied in hardware on an integrated circuit); computer readable code configured to cause any of the methods described herein to be performed when the code is run; an integrated circuit definition dataset that, when processed in an integrated circuit manufacturing system, configures the integrated circuit manufacturing system to manufacture a graphics processing system as described herein and an integrated circuit manufacturing system comprising: a computer readable storage medium having stored thereon a computer readable description of an integrated circuit that describes a graphics processing system as described herein; a layout processing system configured to process the integrated circuit description so as to generate a circuit layout description of an integrated circuit embodying the graphics processing system; and an integrated circuit generation system configured to manufacture the graphics processing system according to the circuit layout description.

The texture address generation unit, cube mapping hardware unit and graphics processing system may be embodied in hardware on an integrated circuit. There may be provided a method of manufacturing, at an integrated circuit manufacturing system, a texture address generation unit, cube mapping hardware unit or a graphics processing system. There may be provided an integrated circuit definition dataset that, when processed in an integrated circuit manufacturing system, configures the system to manufacture a texture address generation unit, cube mapping hardware unit or a graphics processing system. There may be provided a non-transitory computer readable storage medium having stored thereon a computer readable description of an integrated circuit that, when processed, causes a layout processing system to generate a circuit layout description used in an integrated circuit manufacturing system to manufacture a texture address generation unit, cube mapping hardware unit or a graphics processing system.

There may be provided an integrated circuit manufacturing system comprising: a non-transitory computer readable storage medium having stored thereon a computer readable integrated circuit description that describes the texture address generation unit, cube mapping hardware unit or graphics processing system; a layout processing system configured to process the integrated circuit description so as to generate a circuit layout description of an integrated circuit embodying the texture address generation unit, cube mapping hardware unit or a graphics processing system; and an integrated circuit generation system configured to manufacture the texture address generation unit, cube mapping hardware unit or a graphics processing system according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
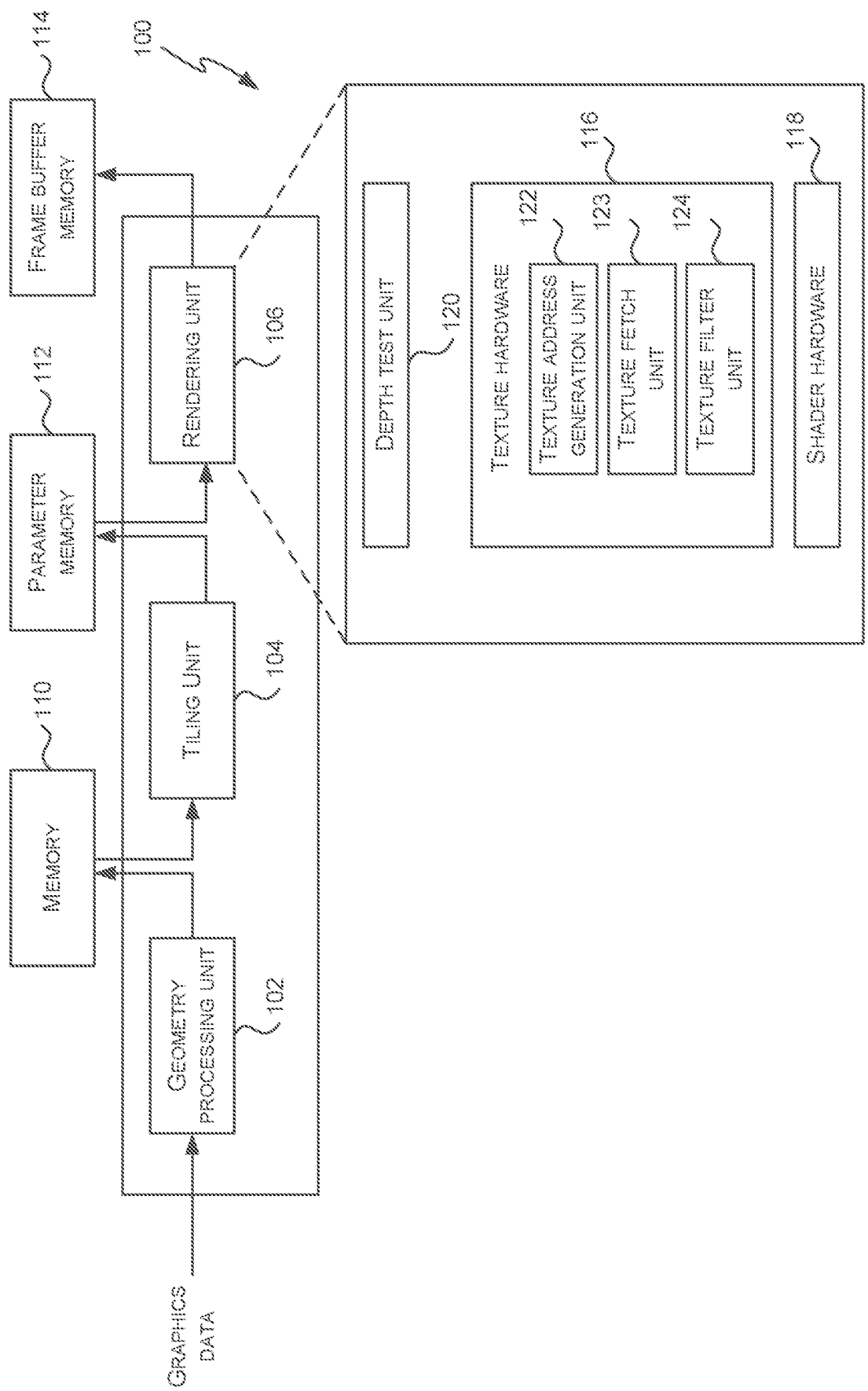
FIG. 1 shows a schematic diagram of an example graphics processing unit (GPU) pipeline.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

FIG. 1 shows a schematic diagram of an example graphics processing unit (GPU) pipeline 100 which may be implemented in hardware within a GPU and which uses a tile-based rendering approach. As shown in FIG. 1, the pipeline 100 comprises a geometry processing unit 102, a tiling unit 104 and a rendering unit 106. The pipeline 100 also comprises one or more memories and buffers, such as a first memory 110, a second memory 112 (which may be referred to as parameter memory) and a third memory 114 (which may be referred to as frame buffer memory) and there may be additional memories/buffers not shown in FIG. 1 (e.g. a depth buffer, one or more tag buffers, etc.). Some of these memories and buffers may be implemented on-chip (e.g. on the same piece of silicon as some or all of the geometry processing unit 102, tiling unit 104 and rendering unit 106) and others may be implemented separately. It will be appreciated that the pipeline 100 may comprise other elements not shown in FIG. 1.

The geometry processing unit 102 receives image geometrical data for an application and transforms it into domain space (e.g. UV coordinates) as well as performs tessellation, where required. The operations performed by the graphics processing unit 102, aside from tessellation, comprise per-vertex transformations on vertex attributes (where position is just one of these attributes) performed by a vertex shader and these operations may also be referred to as 'transform and lighting' (or 'transform and shading'). The geometry processing unit 102 may, for example, comprise a tessellation unit and a vertex shader, and outputs data which is stored in memory 110. This data that is output may comprise primitive data, where the primitive data may comprise a plurality of vertex indices (e.g. three vertex indices) for each primitive and a buffer of vertex data (e.g. for each vertex, a UV coordinate and in various examples, other vertex attributes). Where indexing is not used, the primitive data may comprise a plurality of domain vertices (e.g. three domain vertices) for each primitive, where a domain vertex may comprise only a UV coordinate or may comprise a UV coordinate plus other parameters (e.g. a displacement factor and optionally, parent UV coordinates).

The tiling unit 104 reads the data generated by the geometry processing unit 102 (e.g. by a tessellation unit within the geometry processing unit 102) from memory 110, generates per-tile display lists and outputs these to the parameter memory 112. Each per-tile display list identifies, for a particular tile, those primitives which are at least partially located within, or overlap with, that tile. These display lists may be generated by the tiling unit 104 using a tiling algorithm. Subsequent elements within the GPU pipeline, such as the rendering unit 106, can then read the data from parameter memory 112. The back end of the tiling unit 104 may also group primitives into primitive blocks.

The rendering unit 106 fetches the display list for a tile and the primitives relevant to that tile from the memory 112, and performs texturing and/or shading on the primitives to determine pixel colour values of a rendered image which can be passed to the frame buffer memory 114. The texturing may be performed by texture hardware 116 within the rendering unit 106 and the shading may be performed by shader hardware 118 within the rendering unit 106, although the texture hardware 116 and shader hardware 118 may work together to perform some operations and so, in some implementations, may be considered a single logical element which may be referred to as a texture/shading unit (TSU). The texture hardware 116 comprises fixed function hardware to accelerate common operations, whereas the shader hardware 118 is programmable and typically performs any complex computations that are required.

The texture hardware 116, which may be referred to as the texture processing unit (TPU), operates on texture instructions, each texture instruction relating to a single fragment, where in the context of the methods described herein, a fragment becomes a pixel when it has updated the frame buffer memory 114. The texture hardware 116 typically runs a plurality of texture instructions in parallel, e.g. 4 instructions in parallel, with the 4 instructions corresponding to a 2×2 block of fragments. The use of a 2×2 block of fragments enables the level of detail (LOD) to be determined (e.g. because the rate of change between adjacent fragments can be calculated). The texture hardware 116 may also perform cube mapping. A cube map is a collection of 6 square textures arranged as the surfaces of a cube (centred on the origin). Three component XYZ direction vectors are used to identify a point on that cube and the colour (or other texture value) returned.

It will be appreciated that whilst the methods and hardware described herein refer to an input 2×2 block of fragments, the hardware and methods may be modified to receive as input larger patches of fragments (e.g. an m×n block of fragments, where m and n are both integers greater than or equal to two). Where the input block of fragments is larger than a 2×2 block (e.g. a 3×3 or 4×4 block), the output patches of texels from the methods described herein will be correspondingly larger (e.g. 9×9 patch or 16×16 patch).

As shown in FIG. 1, the texture hardware 116 may comprise a texture address generation unit 122, a texture fetch unit 123 and a texture filtering unit 124. It will be appreciated that the texture hardware 116 may comprise other elements that are not shown in FIG. 1. The texture hardware 116, and in particular the texture address generation unit 122, performs a number of calculations and these may include cube mapping and/or LOD calculations. The texture address generation unit 122 outputs sets of texel indices and filtering data (e.g. in the form of blending weights) and these are then used by the texture fetch unit 123 to fetch data and by the texture filtering unit 124 to perform filtering operations on the fetched data. Depending upon the data input to the texture hardware 116, the filtering may involve different types of filtering operations, e.g. bilinear filtering, trilinear filtering or anisotropic filtering.

The rendering unit 106 processes primitives in each of the tiles and when the whole image has been rendered and stored in the frame buffer memory 114, the image can be output from the graphics processing system comprising the GPU pipeline 100 and displayed on a display.

Described herein are improved methods for texture address generation and improved texture hardware (and in particular an improved texture address generation unit). The methods described herein reduce both the amount of pipelined data and the amount of computation that is performed in order to generate the sets of texel indices and filtering data (e.g. in the form of blending weights) that is output by the texture address generation unit and hence reduces the amount of hardware required to generate texture addresses. As described above, this hardware is fixed function, rather than programmable, hardware. Reducing the amount of hardware that is required reduces the hardware size (which may be particularly important in space-constrained applications, such as in mobile devices) and reduces the power consumption of the hardware (which may be particularly important in devices which are not connected to a constant power supply, e.g. battery-powered devices).

The texture hardware 116 receives as input the fragment coordinates for a 2×2 patch of fragments (e.g. UV coordinates where cube mapping is not used or vectors defined in direction space where cube mapping is used) along with texture instructions for that 2×2 patch. The texture instructions comprise, for example, the sampler state, the image state and the instruction mode. The sampler state comprises information on the filtering that is to be performed, how mipmaps are to be interpolated, how to impose constraints on the fixed function calculations such as LOD biases and clamps, etc. The image state identifies the image type (1D, 2D, 3D or cube), format, extent (width, height, depth), range of defined mipmap levels, data layout etc. The instruction mode comprises information that identifies whether an LOD is to be calculated, whether projection is to be performed (where this projection is incompatible with cube maps), etc. It will be appreciated that in some implementations not all this information may be provided and/or the information may be provided in a different format (e.g. the information may not be provided as sampler state, image state and instruction mode but in a different manner).

In current systems, the texture address generation unit performs independent calculations for each fragment, with the exception of the LOD calculations which involve more than one fragment in order to be able to calculate the rate of change between adjacent fragments. In current systems, the LOD calculations are performed after cube mapping (where cube mapping is required). Whilst the calculations for each of the four fragments, in current systems, are coupled by the LOD calculations, all calculations performed after the LOD calculations are also performed independently for each fragment. As a result, the texture address generation unit in current systems outputs, for each of the fragments in the 2×2 patch, four sets of texel indices (or other means of identifying four texels, such as texel coordinates (e.g. in the form of coordinates i,j or i,j,k that identify texels from mipmap level l) and blending weights (i.e. weights defining how to blend the four identified texels), along with data identifying the mipmap level to which the indices relate.

Figure 2:
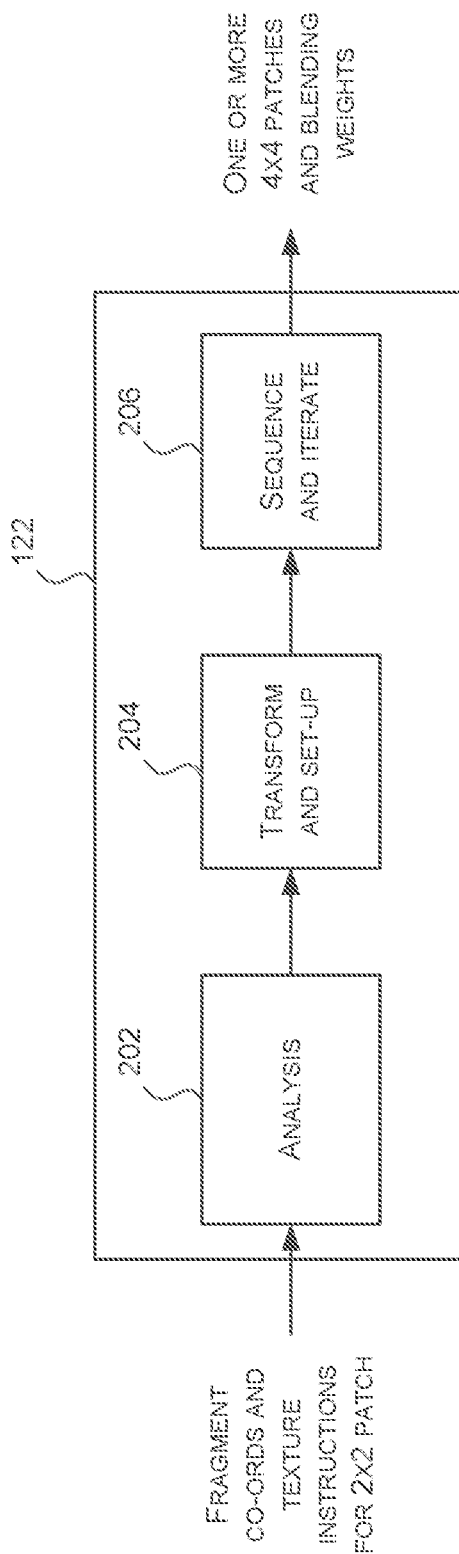
FIG. 2 is a schematic diagram showing an improved texture address generation unit.
Figure 3:
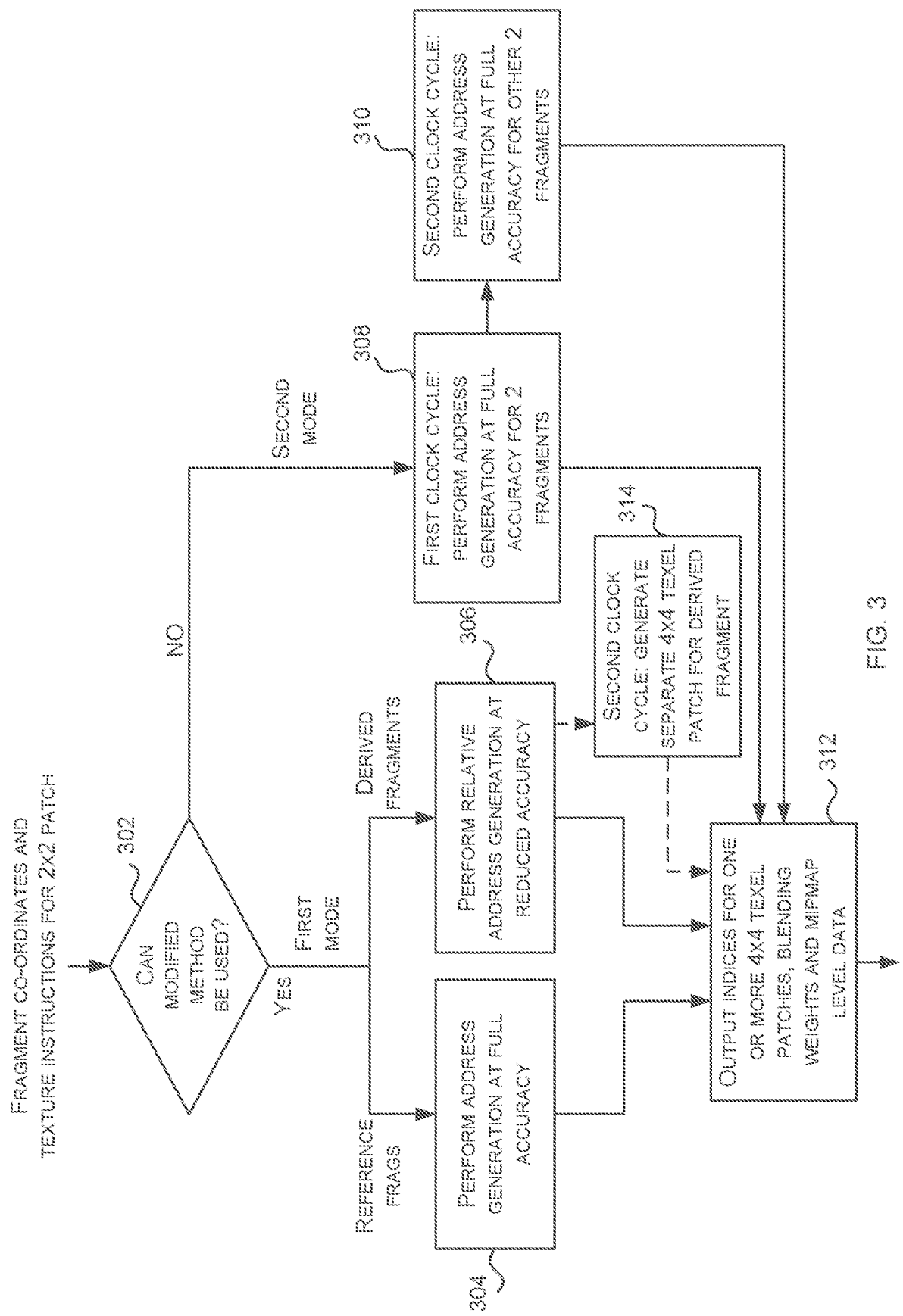
FIG. 3 is a flow diagram showing an improved method of texture address generation that is implemented by the hardware shown in FIG. 2.

An improved method of texture address generation can be described with reference to FIGS. 2 and 3. FIG. 2 is a schematic diagram showing an improved texture address generation unit 122 in more detail. It will be appreciated that the blocks shown are logical blocks and when implemented in hardware logic, the blocks shown in FIG. 2 may be combined together and/or divided into smaller blocks. FIG. 3 is a flow diagram showing an improved method of texture address generation that is implemented by the hardware shown in FIG. 2.

As shown in FIGS. 2 and 3, the input to the method/ hardware is as in current systems, i.e. the fragment coordinates for a 2×2 patch of fragments (e.g. UV coordinates) along with texture instructions for that 2×2 patch. However, unlike current systems, prior to performing any cube mapping or LOD calculations, analysis is performed to determine whether a modified texture address generation method can be used (block 302). This analysis (in block 302) is performed in the analysis hardware logic block 202 and determines whether the four texel indices that will be generated by the texture address generation unit 122 for each of a pair of fragments in the 2×2 input block are likely to lie within the same 4×4 patch of texels or whether they are unlikely or definitely will not lie within the same 4×4 patch of texels, as described in more detail below. This determination may, for example, identify those situations where it cannot be guaranteed that the four fragments will fall within an extended region (determined by the precision of the gradients) and/or where the average separation between fragments increases beyond a threshold (e.g. beyond one texel or beyond a threshold set somewhere between one texel and two texels). The extended region may correspond to the 4×4 patch of texels or may be slightly larger than that, with a late slow down (i.e. using block 314, as described below) in the event that the four fragments fall outside the 4×4 patch of texels. This analysis (in block 302) does not involve the full calculation of the texel indices but instead involves calculation of gradients, i.e. the differences between pairs of fragments in the input 2×2 patch, and uses one or more heuristics or criteria to identify those cases where all eight texels (four for each fragment in the pair) cannot (or are extremely unlikely to) lie within a 4×4 patch of texels. Such cases fail the test ('No' in block 302).

Figure 4:
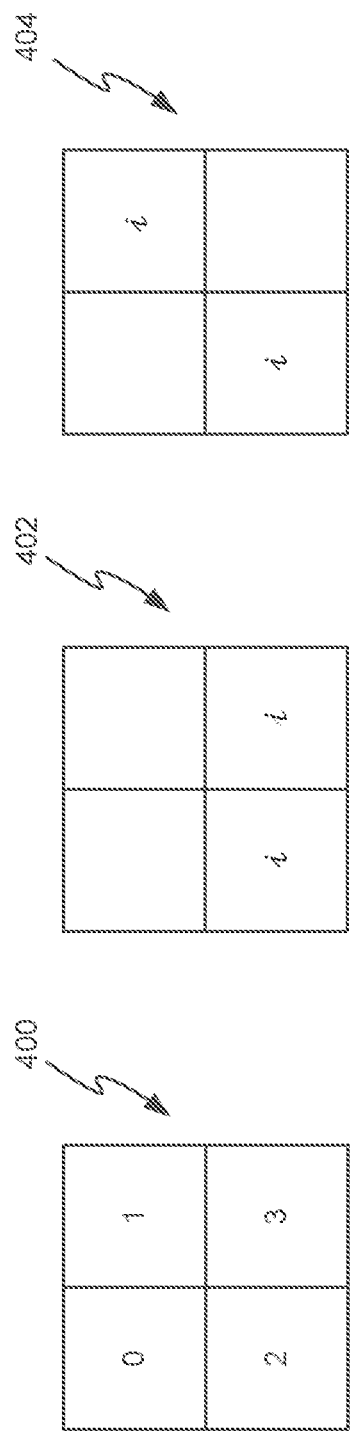
FIG. 4 is a schematic diagram of a 2×2 input patch of fragments.

FIG. 4 shows a schematic diagram of a 2×2 input patch of fragments 400 with the fragments labelled 0-3. When performing the analysis (in block 302), the pairs of input fragments that are considered may be fragments 0 and 1 (i.e. the top left and top right fragments) and fragments 0 and 2 (i.e. the top left and the bottom left fragments). As described above, the differences between these fragments (referred to as gradients) are calculated as part of the analysis. In some examples, a third pair may also be considered comprising fragments 0 and 3 (i.e. the top left and the bottom right fragments). In the event that not all the fragments in the input 2×2 are marked as valid, the analysis (in block 302) first rotates the input patch to ensure that the top left fragment after rotation is always valid. Where the input 2×2 patch comprises four valid fragments, the analysis is repeated for at least two different pairs of input fragments (from the 2×2 input block) and the input 2×2 patch fails the test ('No' in block 302) if, for any two pairs of input fragments, it is determined that all eight output texels (four for each fragment in the pair) cannot (or are extremely unlikely to) lie within a 4×4 patch of texels. If there are only three valid fragments, the test is different, as described below.

If there are exactly two invalid fragments, the input block may be rotated so that the valid fragments, after rotation, are the top left fragment and either the top right fragment or the bottom right fragment as shown after rotation in examples 402 and 404 with invalid fragments labelled with an 'i'. Where there are two or more invalid fragments, the test (in block 302) is always considered as being passed.

In the event that the analysis determines that the test is passed ('Yes' in block 302), then the method proceeds to perform a first mode of texture address generation i.e. to perform texture address generation at full accuracy (e.g. F32 accuracy) for a subset of the fragments, i.e. for a proper subset of the fragments in the input 2×2 patch (block 304) and to perform texture address generation at reduced accuracy for any remaining valid fragments (block 306). The fragments for which texture address generation is performed at full accuracy (in block 304) may be referred to as the 'reference fragments' and the other valid fragments, for which texture address generation is performed at lower accuracy (in block 306) may be referred to as the 'derived fragments'. Where there are only one or two valid fragments in the input 2×2 patch, then the valid fragments are considered the reference fragments and there are no derived fragments. As the analysis (in block 302) has already calculated a number of gradients, i.e. the differences between pairs of fragments in the input 2×2 patch, these are used in performing the texture address generation at full accuracy (in block 304) and are not recalculated. As a result, even where the test (in block 302) is failed, the texture address generation is performed differently to known systems.

The texture address generation performed at full accuracy (in block 304) may also be referred to as texture address performed at a first precision and the texture address generation performed at reduced accuracy (in block 306) may also be referred to as texture address performed at a second precision, where the second precision is lower than the first precision. The terms 'precision' and 'accuracy' are used synonymously herein and the accuracy/relates to the number of bits used to represent the coordinates and/or other values (e.g. input values and/or intermediate values generated during the computation) used in the calculation of the texture addresses, i.e. fewer bits are used to represent coordinates and/or other values where the lower, second precision is used than where the higher, first precision is used.

When calculating the texture address generation at reduced accuracy for the derived fragments (in block 306), the texture address generation is performed relative to one of the reference fragments (i.e. relative to a corresponding reference fragment) and hence the texture address generation process (in block 306) may be referred to as 'relative texture address generation'. When performing the relative texture address generation (in block 306), the calculations performed involve the difference between the derived fragment and the reference fragment instead of the actual (absolute) coordinates of the derived fragment. Consequently, whilst the actual coordinates may comprise 16 integer bits and 8 fractional bits, the gradients, when converted to fixed point, may comprise 3 or 4 integer bits and 12 bits of fractional precision, and hence the calculations for the derived fragments may be performed, in floating point, with only 16 bits of mantissa precision (rather than the 23 mantissa bits of F32) whilst the calculations for the reference fragments may be performed with 12 bits of fractional precision in order that the error in the calculation for both the derived and reference fragments does not exceed 0.6 ULP. As the analysis (in block 302) has already calculated a number of gradients, i.e. the differences between pairs of fragments in the input 2×2 patch, these are used in performing the texture address generation at reduced accuracy for the derived fragments (in block 306) and are not recalculated.

In the event that the analysis determines that the test is failed ('No' in block 302), then the method proceeds to perform texture address generation at full accuracy (e.g. F32 accuracy) for all of the valid fragments (in a similar manner to block 304); however, it is performed for the first two valid fragments in a first clock cycle (block 308) and for the remaining valid fragments in a second clock cycle (block 310). This means that where the test in the analysis block 202 fails, the hardware may be considered to be operating at half-rate compared to known systems as it only performs texture address generation for a maximum of two fragments per clock cycle, whereas if the test in the analysis block 202 passes, the hardware may be considered to be operating at full-rate since it performs texture address generation for all of the valid fragments in the input 2×2 patch in a single clock cycle. As the analysis (in block 302) has already calculated a number of gradients, i.e. the differences between pairs of fragments in the input 2×2 patch, these may be used in performing the texture address generation at full accuracy (in blocks 308 and 310) instead of being recalculated, although where cube mapping is used, the gradients may be recalculated using cube mapped coordinates (rather than mapping the direction space gradients) provided all fragments fall on the same cube face.

Where the test is failed, each of the valid fragments is therefore handled in the same way as a reference fragment where the test is passed. Consequently, for the following description, reference to texture address generation for a reference fragment refers to either texture address generation for a reference fragment in the event that the test was passed, or reference to a valid fragment in the event that the test was failed (with the restriction that only two such fragments can be processed in any clock cycle).

Whilst the throughput is reduced in the event that the test is failed (in block 302), this is likely to occur sufficiently infrequently (i.e. in most cases the test is passed) that the benefit of the reduced hardware requirements outweighs this throughput reduction. Furthermore, the throughput reduction occurs mostly for the more complex calculations (e.g. not for bilinear image filtering) and such calculations may inherently be multi-cycle and so the impact of the additional cycle when performing texture address generation is not significant.

The texture address generation (in blocks 304-310) is performed by the transform and set-up hardware logic block 204 and the sequence and iterate logic block 206 within the texture address generation unit 122. The sequence and iterate logic block 206 also generates the data that is output from the texture address generation unit 122 (block 312).

This data that is output (in block 312) comprises texel indices for one or more 4×4 texel patches (or other means of identifying the 4×4 texel patches, such as texel coordinates) and blending weights for each valid fragment (i.e. weights that identify four texels from within one of the 4×4 texel patches and define how to blend the four identified texels), along with data identifying for each of the 4×4 texel patches, the mipmap level from which it is taken. The 4×4 texel patches may be aligned with the 2×2 texel patch boundaries from current systems. This alignment can simplify addressing and memory retrieval (there is one fewer bit in both the i and j indices) and may also simplify decompression of block-based texture compression formats, since for even sized blocks, aligned 2×2 texels are guaranteed to lie within a single block footprint (such that a single compressed block need be fetched and there can likely be re-use of decoding logic for each of the 2×2 texels). Under normal conditions, fragments should be separated by roughly one texel's width so that, when taking into account bilinear filtering, a 3×3 (unaligned) texel patch should be sufficient to cover all the required texel data. An (2×2) aligned 4×4 patch can always contain an unaligned 3×3 patch without (for the above reasons) significant increasing data retrieval costs and allowing a larger footprint to catch a slightly more sparse distribution fragments (albeit in a space-variant fashion due to the alignment i.e. fragments that align with the patch can be spread farther apart than fragments unaligned with the patch).

Figure 8:
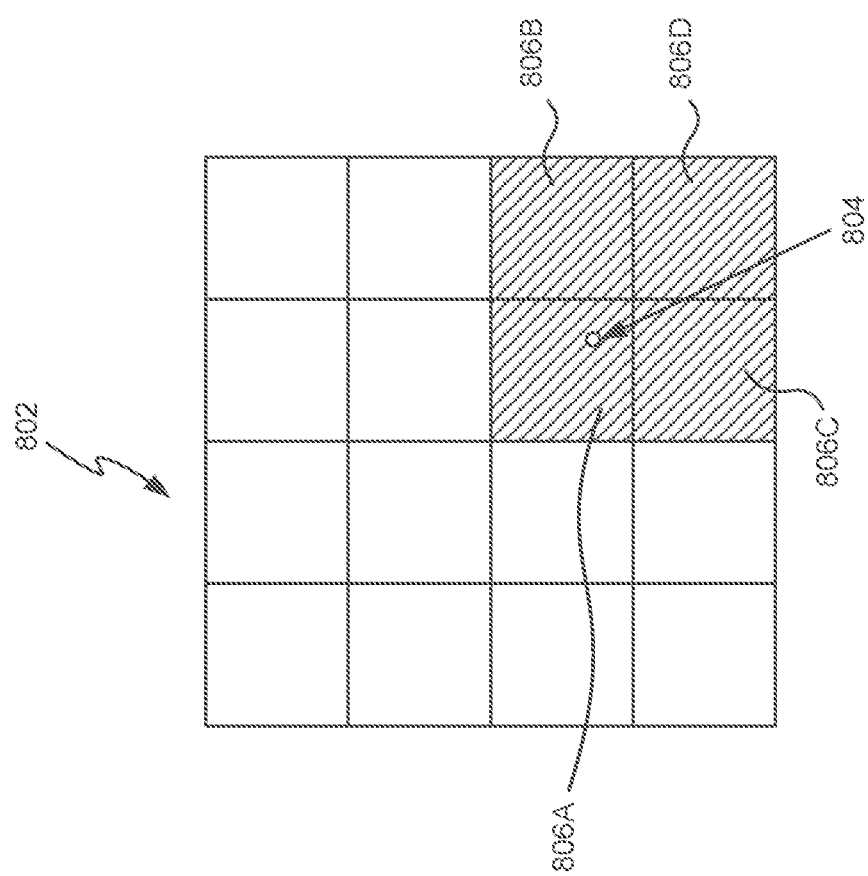
FIG. 8 is a schematic diagram of a 4×4 texel patch.

The data that is output (in block 312) comprises, for each reference fragment, one or more 4×4 texel patches for each reference fragment along with data identifying the mipmap level from which the 4×4 texel patch is taken and blending weights for that reference fragment that identify four texels from within the 4×4 texel patch (e.g. by setting all weights except for four equal to zero) and define how to blend the four identified texels. The data that identifies the four texels and their blending weights for a particular reference fragment may, for example, be provided in the form of four points within the 4×4 texel patch, e.g. e.g. a value of (0.5, 0.5) would do an average of the top left 2×2 texels from the 4×4 patch and a value of (1.5, 0.5) would do an average of 2×2 texels shifted one place to the right etc. An example of this is shown graphically in FIG. 8 which shows a 4×4 texel patch 800 and a single point 804 that identifies four texels (the shaded texels 806A-D) and the blending weights (i.e. based on the position of the point 804 relative to the centres of each of the shaded texels 806A-D). Where the data for a single reference fragment comprises more than one 4×4 texel patch, i.e. it comprises a sequence of two or more 4×4 texel patches (e.g. in order to perform trilinear or anisotropic filtering), the data also comprises a linear interpolation weight factor (which may be referred to as a lerp weight factor) that defines how the data from each of the 4×4 texel patches are combined in turn (e.g. with the weight factor defining how the next 4×4 texel patch is combined with the combination of all previous 4×4 texel patches in the sequence) and when the sequence terminates. Where a lerp weight factor is provided, this may be per fragment or per output (i.e. one for all fragments output from that cycle or from a particular 2×2 input block).

If the 4×4 texel patch, or sequence of 4×4 texel patches, for two (or more) reference fragments are the same, the sequence and iterate hardware unit 206 may reduce the data that is output such that two reference fragments share the same one or more 4×4 texel patches. In such an instance, the rest of the data is provided and it is just that reference fragments share the 4×4 texel patch data, i.e. the data still comprises, for each reference fragment and for each of the 4×4 texel patches, blending weights for that fragment that identify four texels from within the 4×4 texel patch and define how to blend the four identified texels. Where two reference fragments share the same one or more 4×4 texel patches, the reduction in texture address generation hardware is achieved without requiring any additional texel look-ups.

In addition, the data that is output (in block 312) comprises, for each derived fragment, blending weights for that derived fragment that identify four texels from within the 4×4 texel patch(es) of a corresponding reference fragment and define how to blend the four identified texels. In a corresponding manner to that described above (and shown in FIG. 8), the data that identifies the four texels and their blending weights for a particular derived fragment may, for example, be provided in the form of four points within the 4×4 texel patch for the corresponding reference fragment, e.g. a value of (0.5, 0.5) would do an average of the top left 2×2 texels from the 4×4 patch and a value of (1.5, 0.5) would do an average of 2×2 texels shifted one place to the right etc. The reference fragment that corresponds to a derived fragment is the other fragment in the fragment pair that was assessed as part of the test (in block 302). For example, referring to patch 400 shown in FIG. 4, for both derived fragments 1 and 2, the corresponding reference fragment may be fragment 0. Fragment 3 (if valid) may be a second reference fragment or a third derived fragment with the corresponding reference fragment being fragment 0. In another example, referring to patch 402 shown in FIG. 4, the top left fragment may be the corresponding reference fragment for the top right fragment which is a derived fragment.

As described above, the tests performed to determine whether the modified method (involving reference and derived fragments) can be used (in block 302) may not 100% guarantee that the 4 texels to which two (or more) input fragments are mapped fall within the same 4×4 patch of texels but instead the test filters out (by causing the test to be failed) a range of scenarios where it can be determined without doing the full calculations, that the texels cannot be guaranteed to lie within a 4×4 patch. As the test involves calculation of gradients, this may be rephrased as identifying where the gradients (i.e. the difference between the reference fragment and its corresponding derived fragment) cannot be guaranteed to lie within a pre-defined maximum representable range of the gradient after conversion to fixed point (e.g. the raw gradients may result in the texels falling within a 4×4 patch but a series of multiplications e.g. cube mapping, texture dimension scaling, may cause the result to fall outside of say the S4.12 fixed point gradient range). Depending upon the exact nature of the tests used, this means that there may be some cases that pass the initial test (in block 302) where the subsequent calculations for the derived fragments (in block 306) identify an error condition that indicates that the texels do not fall within a 4×4 patch. In such instances it is not necessary to recalculate the values for the derived fragments at full accuracy but instead they are treated as an integer offset that generates a separate 4×4 patch in a subsequent cycle (block 314). This therefore results in a late fallback to half-rate (i.e. later than where a decision is made in block 302 to operate at half-rate).

The operation of the various blocks shown in FIG. 3, and performed by the hardware blocks 202-206 in FIG. 2, are described in more detail below.

There are a number of different tests that may be performed (in block 302) by the analysis hardware block 202 to determine whether the modified method, involving both reference and derived fragments, can be used.

These tests may include one or more of the following:
i. Determining how many valid fragments there are in the input 2×2 patch—as described above, where there are no more than two valid fragments, the test is always considered as being passed ('Yes' in block 302).
ii. Determining whether the input data includes shader supplied gradients—in such cases, there is no correspondence with the fragment locations and so in the event that there are more than two valid fragments, the test is always considered as being failed ('No' in block 302).
iii. Determining whether the input data indicates use of anisotropic filtering—in such cases, if there are more than two valid fragments, the test is always considered as being failed ('No' in block 302).
iv. Determining whether the input data indicates use of a projection operation (e.g. similar to, but different from, cube mapping)—in such cases, if there are more than two valid fragments, the test is always considered as being failed ('No' in block 302).
v. Determining whether a pair of fragments cannot be replaced by a reference fragment and a derived fragment (see reasons below), in which case the outcome is dependent upon the number of valid fragments. If there are four valid fragments, then if two pairs of fragments cannot be replaced, the test is considered as being failed ('No' in block 302). If there are only three valid fragments then the test is only considered as being failed if neither pair of fragments can be replaced or if a diagonal gradient pattern is being used (e.g. the fragment pairs comprise: (i) top left and bottom right fragments and (ii) bottom left and top right fragments, instead of the default (i) top left and top right fragments and (ii) top left and bottom left fragments) and the trailing diagonal pair (bottom left and top right fragments) cannot be replaced by a reference fragment and a derived fragment. As described below it is this test which involves the use of gradients, i.e. the differences between pairs of fragments in the input 2×2 patch, and so these are calculated as part of the analysis (in block 302).

Of the tests listed above, test (v) is essential but tests (i)-(iv) are optional and omitting one or more of them may incur overhead and/or result in the late fallback to half rate (via block 314, as described above). Whilst test (i) is listed as optional, it is a simple test and so there is no reason to omit it. Omitting test (ii) increases overhead because if the modified method is used in situations where there are shader supplied gradients, the reference/derived gradient have no other use and also since it results in a separate LOD calculation for each fragment (as well as a separate cube mapping gradient transformation if the image is a cube map), this mode is inherently much more expensive than the implicit instructions, which share a single set of gradients and LOD for all the valid 2×2 fragments. With regard to test (iii), anisotropic filtering adds the complexity that in most scenarios, it is not known how spaced the neighbouring fragments will be until the anisotropic LOD is calculated (e.g. 16× aniso may mean neighbouring fragments are 16 texels apart) and this is a computationally expensive operation. In some implementations a modified version of test (iii) may be performed with the gradients to see if the particular scenario is close to isotropy (i.e. the anisotropic ratio is close to one) and the test may only result in a fail ('No' in block 302) in the event that this is not found to be the case (i.e.

where the scenario is not close to isotropy). If test (iv) is omitted, then projections may be handled using a similar test as for cube mapping (e.g. as described below with reference to FIGS. 6 and 7); however the benefit of having square dimensions for the textures is lost, resulting in additional complexity.

Where multiple of the tests (i)-(v) above are used, they may be performed in substantially the order in which they are listed above or any of tests (i)-(iv) that are used may be performed before test (v), such that the conditions that result in a fast pass/fail are performed before the more detailed test (v). Even if a fail is identified before performing test (v), the gradients are still calculated since they are used subsequently in the texture address generation process.

Referring to test (v) above, a pair of fragments may not be replaceable by a reference fragment and a derived fragment for one of a number of reasons and various examples are described below. In making the determination in test (v), any combination or one or more of the sub-tests below may be used, or all of the sub-tests may be used. In an implementation, all those tests listed below that bound the magnitude of the gradients are used.

A pair of fragments may be considered not replaceable if it is determined that the step between texels for neighbouring fragments is greater than a predefined threshold, which may be set at two or may be set at three—this may be referred to as the pair of fragments not being sufficiently spatially coherent. This has the effect that the two groups of four texels (one group for each of the two fragments) will not fall within the same 4×4 patch of texels. There are a number of different criteria that can result in this insufficient special coherence and one or more of these tests may be used, with the pair of fragments being considered not replaceable if any one of the tests used indicate that the pair of fragments are not sufficiently spatially coherent, i.e. that the texel step between neighbouring fragments is greater than two.

The spatial coherence of a pair of fragments may be determined, where the texture address generation unit 122 calculates the LOD itself (rather than a per-fragment LOD value being supplied by the shader), based on the size of the sampler and/or shader-supplied LOD bias. If a bias of less than −1 is used, this means that the texel step between neighbouring fragments may be greater than two (since the negative bias selects a more detailed mipmap with texel spacing as $2^{-bias}$) and hence the pair of fragments may be considered not replaceable by a reference fragment and a derived fragment. Furthermore, where a per-fragment bias is specified, unless the bias of the two fragments in the pair is the same after rounding, the two fragments are not replaceable by a reference fragment and a derived fragment.

The texel step between neighbouring fragments may also grow, such that it exceeds two, where the mipmap is incomplete, i.e. where the maximum level of detail is restricted either because of a clamp (e.g. as specified as part of the input texture instructions, such as the sampler state) or because the higher levels of detail are not defined in memory. If the LOD implied by the largest gradient (i.e. the largest difference between a pair of fragments) is larger than the maximum selectable/explicitly calculated LOD, the texel step will grow such that the texel step between neighbouring fragments is greater than the predefined threshold. In contrast, if the exponent (of each gradient component) is less than the minimum level of detail (where mipmap levels are numbered such that the highest resolution/largest mipmap level is level 0 and lower resolution mipmap levels are levels 1, 2, 3 . . . ), then the texel step between neighbouring fragments has an upper bound of around one and this does not indicate that that the fragments are not replaceable.

A pair of fragments may be considered not replaceable if it is determined that a derived fragment would not (or is not highly likely to) use the same mipmap level as its corresponding reference fragment. This may be determined where the LOD parameters do not match between two fragments in a pair of fragments (e.g. that would become the reference and corresponding derived fragment). The LOD parameters may be a shader-supplied per fragment minimum LOD clamp and either a shader-supplied per fragment LOD bias (which is added to the LOD value calculated in hardware) or a shader-supplied per fragment LOD (which replaces the need to calculate an LOD value in hardware). The shader supplied parameters are part of the input data to the texture hardware 116. Unlike the other subtests, this is not essential since it does not relate to gradient accuracy. If it is not used, offsets may be applied at the relevant mipmap level for each fragment. However, these additional parameters need to be registered and separate calculations performed, and so this reduces the benefit achieved by using the modified method. Alternatively the decision could be made on the basis that the mipmap levels agree within some margin of error, e.g. of the form raw value+small offset for the derived fragments.

A pair of fragments may be considered not replaceable if it is determined that, where cube mapping is used, the reference fragment and derived fragment do not map to the same face. Also, where cube mapping is used, a pair of fragments may be considered not replaceable if it is determined that treatment of derivatives only will result in catastrophic cancellation during computation of cube mapping for a derived fragment. This is described in more detail below.

As described above, many of the tests involve the use of gradients, i.e. the differences between pairs of fragments in the input 2×2 patch, and so these are calculated as part of the analysis (in block 302). Consequently when the texture address generation is subsequently performed (in blocks 304-310), these gradients are generally not recalculated. As the gradients that are calculated as part of the analysis are in domain space (i.e. UV space), rather than texture space, they need to be transformed before they are used in texture address generation.

The texture address generation at full accuracy for a reference fragment, or for a fragment where the test (in block 302) fails, is performed in a similar manner (in blocks 304, 308 and 310). The calculations involve modified LOD calculations (compared to current systems) because the gradients have already been calculated and may involve modified cube mapping calculations (compared to current systems) again because the gradients have already been calculated, but as detailed above, the input shader information defines whether cube mapping is, or is not, to be used in any calculation.

Figure 5:
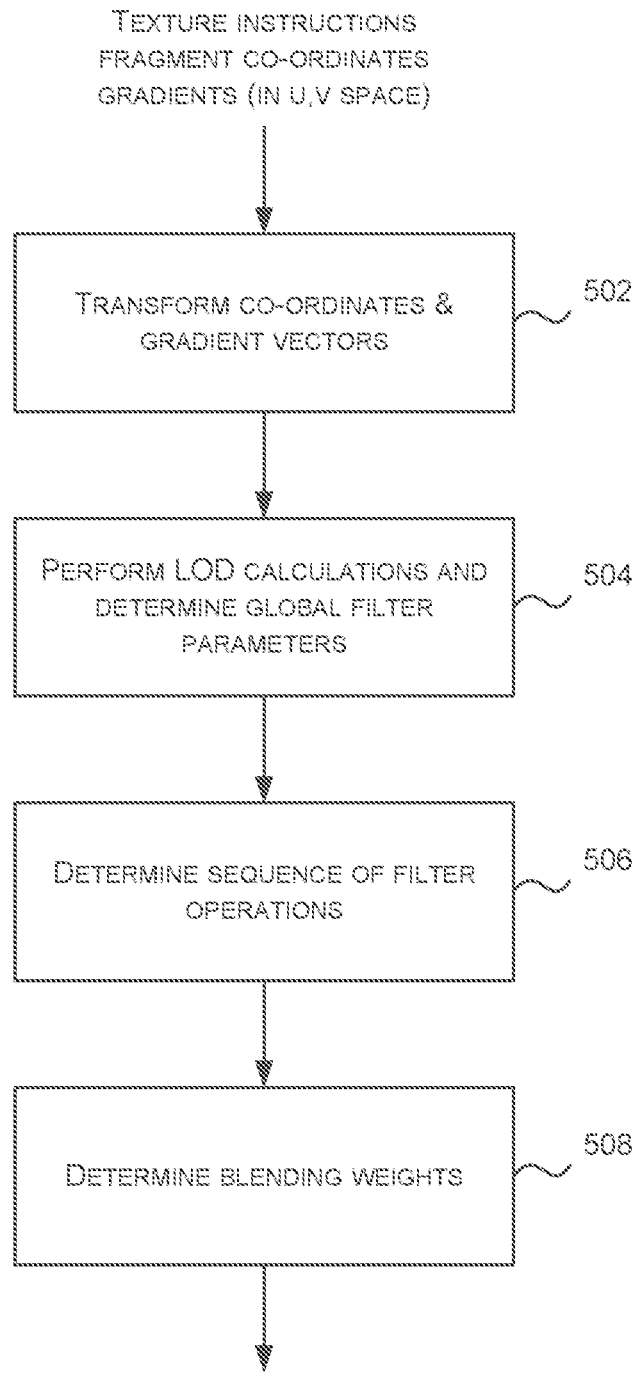
FIG. 5 is a flow diagram showing the four logical stages of texture address generation.

The stages of texture address generation, which are performed by the texture address generation unit 122 and more particularly by the transform and set-up hardware unit 204 and the sequence and iterate hardware unit 206 are shown in FIG. 5. This same sequence is followed irrespective of whether the calculations are performed for reference fragments at full accuracy (in blocks 304, 308 and 310) or derived fragments at reduced accuracy (in block 306); however the operations performed at each stage will differ because for derived fragments only the gradients are initially considered (i.e. the difference between the derived fragment and its corresponding reference fragment) and only towards the end of the sequence are the resulting differences added to the results for the reference fragment to determine the output data for the derived fragment.

The flow diagram of FIG. 5 shows four logical stages, although it will be appreciated that the operations may be divided up in different ways. The first two logical stages (blocks 502-504) are implemented within the transform and set-up hardware unit 204 and the last two logical stages (blocks 506-508) are implemented within the sequence and iterate hardware unit 206. In some examples, there may be five hardware units within the texture address generation unit 122, i.e. the analysis unit 202 and then one hardware unit that corresponds to each of the blocks in FIG. 5.

The first stage in the flow diagram of FIG. 5 takes as input the gradients calculated in the analysis hardware block 202 (in block 302) as well as the other data received as input to the texture address generation unit 122 and performs a number of transformations (including the principal axes transformation in the LOD calculation) and/or projections (block 502), although the exact nature of these will depend upon whether cube mapping is used or not. The operations that are performed include projection of coordinates and rotation of gradient vectors.

The second stage in the flow diagram of FIG. 5 (block 504) performs the LOD calculations. The LOD calculations only happen once for all fragments in the input 2×2 patch unless, as a consequence of cube mapping, different reference fragments are on different cube faces, in which case LOD calculations are performed for each of the fragments in the input 2×2 patch. The LOD calculations are used to determine the mipmap from which texels will be accessed. The second stage also determines the global filter parameters, such as what filtering modes are to be used.

The third stage in the flow diagram of FIG. 5 (block 506) determines the sequence of filter operations that are to be performed and this includes identifying the patches that are accessed (where this identification may involve a bounding box calculation).

Finally, the fourth stage in the flow diagram of FIG. 5 (block 508) iterates through the sequence of filter operations and calculates the blending weights for the four identified texels. This involves conversion of texel coordinates in floating point to texel indices and fractional (u,v) blending weights. Where used, this fourth stage also determines the lerp weight factor.

Where the flow diagram of FIG. 5 is used for derived fragments (in block 306), the calculations involve use of the gradients (as calculated in the analysis block) instead of absolute coordinates. The calculations (in particular in the first two stages of the flow diagram of FIG. 5) therefore calculate the difference between texel coordinates (in floating point format) for the derived fragment and the reference fragment and this difference value is rescaled to the appropriate mipmap level. In the third block this computed difference value is added to the values for the reference fragment to generate the results for the derived fragment. The third block (block 506) therefore provides a final check of whether the texels for the derived fragment fall within the same 4×4 texel patch as the corresponding reference fragment. If, having added the difference value (which may be referred to as the delta) for the derived fragment to the texel coordinates calculated for the reference fragment, the texel coordinates fall outside the 4×4 patch, the sequence of filter operations cannot be determined for the derived fragment and at that time an error condition is identified and the determination of a separate 4×4 patch for the derived fragment is performed in a second clock cycle (in block 314).

Figure 6:
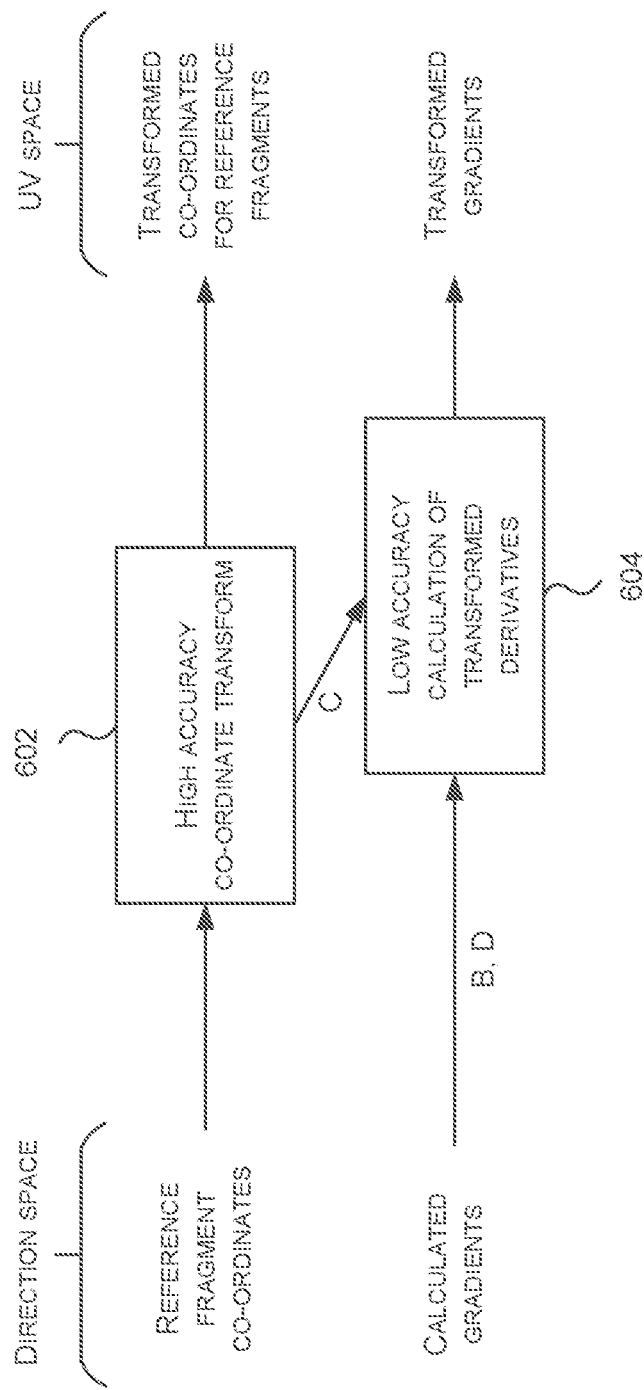
FIG. 6 is a schematic diagram showing a first example of improved cube mapping hardware.

By using the methods described above (and shown in FIGS. 3 and 5) the fastest calculations (such as bilinear image filtering) are performed at full-rate and the more complex calculations (which are inherently multi-cycle) are handled at half-rate. The tests for determining whether a pair of fragments cannot be replaced by a reference fragment and a derived fragment which consider the gradients and whether the texture accesses are spatially coherent (i.e. they fall within the same 4×4 patch of texels) can be performed with little additional computation. However, where cube maps or projection is performed the analysis is more complex. As a consequence, where projection other than cube mapping is used, this may be considered to be a fast fail condition ('No' in block 302, where test (iv) is used) and the second mode of texture address generation is used (blocks 308-310). Where cube mapping is used, in addition to determining whether the reference fragment and derived fragment map to the same face, additional tests are performed to determine whether, when performing cube mapping on the derived fragments, treatment of derivatives only (i.e. rather than absolute coordinates) will result in catastrophic cancellation of terms. In the event that catastrophic cancellation is determined to be a possibility, then the test (in block 302) fails, and the second mode of texture address generation is used.

Where cube mapping is used (as defined in the input shader information, e.g. in the image state information) then this is performed within block 502 in FIG. 5. As noted above, the cube mapping method used may be modified to perform full accuracy coordinate transforms for the reference fragments (block 602) and reduced accuracy calculations based on transforming the gradients (also referred to as derivatives) for the derived fragments (block 604), as shown in FIG. 6. As shown in FIG. 6, the hardware logic takes as inputs the coordinates for the reference fragments, and the gradients which have been calculated at high accuracy in the analysis hardware block 202 (as described above). As cube mapping is being used, the input reference fragment coordinates are not in normalised coordinates (i.e. they are not in UV space) but are instead vectors defined in direction space (e.g. 3 component vectors, which each define a vector, not necessarily normalised, that points out from the centre of the notional cube).

The modified version of cube mapping shown in FIG. 6 can only be performed if treatment of the derivatives only does not result in catastrophic cancellation. The term 'catastrophic cancellation' is used herein to refer to a situation where the relative error becomes unacceptably large, even if the absolute error remains unchanged (e.g. if the calculated value becomes small in comparison to the absolute error). Catastrophic cancellation may occur due to terms cancelling as part of the derivative transform (which includes a subtraction operation, as detailed below); however, accuracy requirements are also limited by the maximum resolution of the cube map such that there may be some scenarios where cancellation occurs but it is not deemed catastrophic. Catastrophic cancellation may be deemed to not occur if the relative error does not exceed a predefined threshold. In various examples, the modified version of cube mapping may be performed where the texel coordinates can be determined to 16.8 floating point accuracy.

There are several different tests which may be applied to check if the maximum relative error on the inputs to the subtraction exceeds a pre-defined error threshold, $\varepsilon_0$, and various examples are described below. Any combination of the tests below may be used, but because the accuracy requirements are limited by the maximum resolution of the cube map, some of the tests are more conservative than others. For example, if the first test below is used on its own, it can be performed with minimal additional computation but will result in the test failing in some situations where another test (such as the fourth test below) would identify that although cancellation may occur, if it does, it is not catastrophic (e.g. where the LOD is outside the normal range and hence it may be absolute error, rather than the relative error, that is significant).

The cube map coordinate transform may be defined as (equation 1):

$$\bar{s}_{face} = \frac{1}{2} \cdot \frac{\bar{s}_c}{|r_c|} + \frac{1}{2}$$

where the input coordinates for a fragment are (s,t,r), $\bar{s}=(s,t)$ and $r_c$ is the major component. Similarly, the cube map derivative transform may be defined as (equations 2 and 3):

$$\frac{\partial \bar{s}_{face}}{\partial x} = \frac{1}{2|r_c|} \cdot \left(\frac{\partial \bar{s}_c}{\partial x} - \frac{\partial r_c}{\partial x}\frac{\bar{s}_c}{|r_c|}\right)$$

$$\frac{\partial \bar{s}_{face}}{\partial y} = \frac{1}{2|r_c|} \cdot \left(\frac{\partial \bar{s}_c}{\partial y} - \frac{\partial r_c}{\partial y}\frac{\bar{s}_c}{|r_c|}\right)$$

And these can be rewritten as (equation 4):

$$\bar{s}_{face,1} - \bar{s}_{face,0} = \frac{1}{2|r_{c,1}|} \cdot \left(\delta \bar{s}_c - \frac{\bar{s}_{c,0}}{|r_{c,0}|}(\delta r_c)\right)$$

Where the reference and derived fragments are denoted 0 and 1 respectively and:

$\delta \bar{s}_c = \bar{s}_{c,1} - \bar{s}_{c,0}$ $\delta r_c = |r_{c,1}| - |r_{c,0}|$ This is of the form:

$\bar{s}_{face,1} - \bar{s}_{face,0} = A(B-CD)$ where:

$A = \frac{1}{2|r_{c,1}|}$ $B = \delta \bar{s}_c$ $C = \frac{\bar{s}_{c,0}}{|r_{c,0}|}$ $D = \delta r_c$ Of these four terms, A-D, terms B and D are high accuracy gradients which are calculated as part of the analysis hardware block 202 (as described above) and provided as inputs to the hardware that performs the modified cube mapping (within the transform and set-up hardware block 204), as shown in FIG. 6. Term C is calculated at high accuracy as part of the high accuracy coordinate transform (in block 602), as is clear from equation 1 above. The maximum relative error on the inputs to the subtraction (i.e. to B−CD) primarily originate in term C.

As part of the low accuracy calculation (in block 604), term A is calculated at reduced accuracy. To reduce the computational cost of calculating A(B−CD) for each of the derived fragments and for each of two dimensions, a subset of the calculations are performed at reduced accuracy. For example, when calculating A(B−CD), the calculation of the product of C and D may be performed at high accuracy (e.g. full F32 accuracy), the subtraction B−CD may be performed at reduced accuracy and the multiplication of the result with A (the low accuracy input) may also be performed at reduced accuracy. In another example, both the product of C and D and the subtraction operation may be performed at high accuracy and the final multiplication by A performed at reduced accuracy.

Catastrophic cancellation occurs if the value of (B−CD) becomes very small (i.e. if B≈CD), because then the absolute error will translate into a very large relative error that is unlikely to satisfy a predefined error bound. Whilst the worst case errors occur due to cancellation of terms, in addition to this, the multiplication by A also contributes to the accumulated error and this should be accounted for in the calculated error tolerance.

A first example test for catastrophic cancellation may be performed using the exponents of B and D, denoted exp B and exp D respectively, with an estimated exponent for C (since C has yet to be calculated), denoted exp C. The estimated exponent of C may be determined from the exponents of $\bar{s}_{c,0}$ and $|r_{c,0}|$ as detailed below. This test determines that catastrophic cancellation may occur, given fully accurate inputs B, C and D, if: |exp B−(exp C+exp D)|≤2. This is set out in more detail below.

In particular, since we know, for finite non-zero x, $$2^{\lfloor \log_2 |x| \rfloor} \leq |x| < 2^{\lfloor \log_2 |x| \rfloor + 1}$$

where $\lfloor \log_2 |x| \rfloor$ is the exponent, we also immediately have $$2^{-\lfloor \log_2 |x| \rfloor - 1} < \frac{1}{|x|} \leq 2^{-\lfloor \log_2 |x| \rfloor}$$

such that $$2^{\lfloor \log_2 |x| \rfloor - \lfloor \log_2 |y| \rfloor - 1} < \left|\frac{x}{y}\right| < 2^{\lfloor \log_2 |x| \rfloor - \lfloor \log_2 |y| \rfloor + 1}$$

i.e.

$$\lfloor \log_2 |x| \rfloor - \lfloor \log_2 |y| \rfloor - 1 < \log_2 \left|\frac{x}{y}\right| < \lfloor \log_2 |x| \rfloor - \lfloor \log_2 |y| \rfloor + 1$$

then taking the floor of each term (which clearly leaves the terms on the left and the right unaffected but reduces the value in the middle, without violating the ordering):

$$\lfloor \log_2 |x| \rfloor - \lfloor \log_2 |y| \rfloor - 1 \leq \left\lfloor \log_2 \left|\frac{x}{y}\right| \right\rfloor < \lfloor \log_2 |x| \rfloor - \lfloor \log_2 |y| \rfloor + 1$$

$$\Rightarrow \lfloor \log_2 |x| \rfloor - \lfloor \log_2 |y| \rfloor - 1 \leq \left\lfloor \log_2 \left|\frac{x}{y}\right| \right\rfloor \leq \lfloor \log_2 |x| \rfloor - \lfloor \log_2 |y| \rfloor + 1$$

In other words, the exponent of a fraction is either the difference in exponents or one less than that value. The bounds are reversed for a product of terms; the exponent of a product is either the sum of exponents or one greater than that value:

$$\lfloor \log_2|x| \rfloor + \lfloor \log_2|y| \rfloor \leq \log_2|xy| < \lfloor \log_2|x| \rfloor + \lfloor \log_2|y| \rfloor + 2 \Rightarrow \lfloor \log_2|x| \rfloor + \lfloor \log_2|y| \rfloor \leq \lfloor \log_2|xy| \rfloor \leq \lfloor \log_2|x| \rfloor + \lfloor \log_2|y| \rfloor + 1$$

Catastrophic cancellation occurs when $$\frac{|B - CD|}{|B| + |CD|} \ll 1.$$

Assume $|B| \geq |CD|$. Then (using $\lfloor \log_2|x| \rfloor \leq \log_2|x| < \lfloor \log_2|x| \rfloor + 1$)

$$\frac{1}{4}\left(1 - 2^{\lfloor \log_2|CD| \rfloor - \lfloor \log_2|B| \rfloor + 1}\right) <$$

$$\frac{1}{2|B|}\left(2^{\lfloor \log_2|B| \rfloor} - 2^{\lfloor \log_2|CD| \rfloor + 1}\right) < \frac{|B| - |CD|}{|B| + |CD|} \leq \frac{|B - CD|}{|B| + |CD|}$$

Since this is a lower bound, it must be small or negative in order for catastrophic cancellation to occur:

$$\tfrac{1}{4}(1 - 2^{\lfloor \log_2|CD| \rfloor - \lfloor \log_2|B| \rfloor + 1}) \ll 1 \Rightarrow$$
$$2^{\lfloor \log_2|CD| \rfloor - \lfloor \log_2|B| \rfloor + 1} \geq 1 \Rightarrow \lfloor \log_2|CD| \rfloor - \lfloor \log_2|B| \rfloor + 1 \geq 0$$

But since, by assumption, $|B| \geq |CD|$, the exponent of B must always be at least as large as the exponent of CD, we may write:

$$0 \leq \lfloor \log_2|B| \rfloor - \lfloor \log_2|CD| \rfloor \leq 1$$

The same inequality is obtained with B and CD exchanged if we instead assume $|CD| \geq |B|$ such that $$0 \leq |\lfloor \log_2|B| \rfloor - \lfloor \log_2|CD| \rfloor| \leq 1$$

The first part above gives us a bound on the exponent of the product CD:

$$0 \leq \lfloor \log_2|CD| \rfloor - \lfloor \log_2|D| \rfloor - \lfloor \log_2|\bar{s}_{c,0}| \rfloor - \lfloor \log_2\|r_{c,0}\| \rfloor \leq 1$$

This can then be combined with the second part above ($|\lfloor \log_2|B| \rfloor - \lfloor \log_2|CD| \rfloor| \leq 1$) to get $$|\lfloor \log_2|B| \rfloor - \lfloor \log_2|D| \rfloor - \lfloor \log_2|\bar{s}_{c,0}| \rfloor - \lfloor \log_2\|r_{c,0}\| \rfloor| \leq 2$$

This uses the fact that avoidance of the mantissa multiplication in CD underestimates the magnitude of the result, while avoidance of the mantissa division overestimates the magnitude of the result.

A second example test for catastrophic cancellation is to check that B and CD have opposite signs as then the result of the subtraction will not be close to zero but instead $|B-CD|>|B|$ and $|B-CD|>|CD|$. As noted above, C has yet to be calculated but the sign of C is the same as the sign of $\bar{s}_{c,0}$.

A third example test for catastrophic cancellation is given by the following expression (equation 5):

$$|\delta \bar{s}_c| > 2 \cdot |\delta r_c| \Rightarrow \varepsilon < 3\varepsilon_0 \cdot 2^{-bias}$$

Or using the A, B, C, D notation:

$$|B| > 2 \cdot |D| \Rightarrow \varepsilon < 3\varepsilon_0 \cdot 2^{-bias}$$

where $\varepsilon$ is the relative error and $\varepsilon_0$ is the pre-defined error threshold (as above). Equation 5 defines that if $|\delta \bar{s}_c|>2 \cdot |\delta r_c|$, then it is possible to put a bound on the resulting error. The expression $|\delta \bar{s}_c|>2 \cdot |\delta r_c|$ is derived from analysis of B−CD since the value of C will be less than or equal to one (because $r_c$ is the major component). This third example test may be considered as an alternative to the first and/or second example tests or may be used in combination with one or both of those example tests. Unlike the first two example tests, the third example test uses a direct comparison of terms rather than the exponent test (of the first example test) or the sign test (of the second example test). The test that is used (e.g. the first, second or third example test) may be application dependent.

From equation 5 it is clear that as soon as there is a negative bias, or as soon as the bias is less than −1 (as a bias of −1 will still, in most cases, result in a bounded error), the error can grow enormously, resulting in catastrophic cancellation and if there is any negative bias the modified cube mapping method may not be used. Cases where there is a negative bias may be filtered out by other tests (as described above).

In some examples, three tiers of testing may be used: first to identify if cancellation may occur (e.g. using the first and/or second example tests above), the second to identify whether, if cancellation does occur, the cancellation is catastrophic (e.g. using the third test above) and finally to check whether, as a consequence of the texture resolution, even though the relative error becomes very large (and hence the cancellation may be considered catastrophic), the available mipmaps and conditions on mipmap selection mean that it is the absolute, rather than the relative error, that is important. This third tier is described below.

Since it is the error in terms of texels (i.e. the error after mapping to a mipmap level) that is the relevant error, one or more tests may also be used that include the texture dimensions, $w_\lambda$ at the LOD, $\lambda$ (where $w_\lambda$ increases as $\lambda$ reduces). In particular, these tests may be performed to check for situations where the error affects the selection of a higher resolution and hence lower level mipmap level (i.e. a lower LOD, since LOD0 corresponds to the base level mipmap and hence results in selection of the highest resolution and hence largest texture). A similar situation may also occur where the mipmap chain is incomplete and so it is not possible to select a mipmap of the desired resolution and instead a higher resolution mipmap is used. The LOD may be provided as one of the inputs (in the case of explicit LODs which may be provided as a floating point value or an integer) and subject to any LOD clamps which result in use of a different LOD that is different to the provided LOD. Alternatively, the LOD may be calculated and in such cases, any LOD clamps may result in use of an LOD that is different to the calculated LOD. As it is not possible to determine the LOD until the cube gradient transformation has been evaluated, where the LOD is implicit (i.e. calculated rather than explicitly provided) the worst case LOD may be used in the tests. The worst case LOD may be determined by determining the minimum (i.e. highest resolution) mipmap level that can be addressed taking into account the minimum LOD clamps. Often the cube map texture is of low enough resolution (compared with the maximum supported) for this to be a useful test. In determining the worst case LOD, the bias is ignored because that just results in an offset from the unknown calculated LOD and whatever value the LOD is calculated as, it cannot fall below the clamped minimum.

A test that includes the texture dimensions may identify situations where, even if cancellation occurs, it is not catastrophic since the relative error remains bounded. A fourth example test, which includes the texture dimensions, may be defined as either:

$$w_\lambda \frac{\max(\delta \bar{s}_c)}{|r_{c,1}|} < 2^n$$

or $$w_\lambda \frac{\max(\delta \bar{s}_c)}{|r_{c,0}|} < 2^n$$

where n is a threshold determined by error accuracy analysis. One of these two equalities are used to check that the worst case still satisfies the inequality. In a variation of these inequalities, the exponents of the terms (e.g. exponents of $\delta \bar{s}_c$ and $|r_{c,0}|$) may be used in place of using this inequality directly to avoid computation.

In other examples, a test may be used that checks whether the following vector inequality (operating on a component-wise basis) is satisfied (equation 6):

$$\frac{1}{4}w_{\lambda_{min}} \cdot \frac{1}{|r_{c,1}|}\left[\left(\frac{|\widetilde{\delta \bar{s}_c} \cdot \bar{e}_s|}{|\widetilde{\delta \bar{s}_c} \cdot \bar{e}_t|}\right) + \left(\frac{|(\widetilde{\cdots}) \cdot \bar{e}_s|}{|(\widetilde{\cdots}) \cdot \bar{e}_t|}\right)\right]\varepsilon_0 < \varepsilon\binom{1}{1}$$

Where $\frac{1}{2}\varepsilon_0$ is the maximum error for any of the terms, $w_{\lambda_{min}}$ is the width of the largest available cube map level (corresponding to the minimum clamped LOD), $\bar{e}_s=(1,0)$, $\bar{e}_t=(0,1)$ and the symbols with tildes above them represent the calculated approximation of their exact calculated counterparts. If this inequality is satisfied for a target error $\varepsilon$ (for each component), then the error requirements are satisfied irrespective of whether the LOD is clamped (e.g. due to the availability of mipmaps) at either end of the range. Equation 6 may be used as a base inequality from which further derived bounds are constructed (including some of the previous examples) using approximations of the approximations (e.g. by just looking at exponents). As a result there may be many false positive failures, but this avoids the need to perform the full calculation to determine whether the approximation is good enough.

If the mipmap is complete or it is known that clamping from above is definitely not applied, then a different (vector) inequality may be used. Using the notation of equation 6, this is (equation 7):

$$\min\left(\frac{1}{4}w_{\lambda_{min}}, 2^{-\beta} \cdot |r_{c,1}|\left(\frac{1}{\frac{|(\tilde{\delta s} - (\tilde{\cdots})) \cdot \bar{e}_s|}{|(\tilde{\delta s} - (\tilde{\cdots})) \cdot \bar{e}_t|}}\right)\right).$$

$$\frac{1}{|r_{c,1}|}\left[\left(\frac{|\widetilde{\delta \bar{s}_c} \cdot \bar{e}_s|}{|\widetilde{\delta \bar{s}_c} \cdot \bar{e}_t|}\right) + \left(\frac{|(\widetilde{\cdots}) \cdot \bar{e}_s|}{|(\widetilde{\cdots}) \cdot \bar{e}_t|}\right)\right]\varepsilon_0 < \varepsilon\binom{1}{1}$$

where $\beta$ is the bias which is calculated prior to the accuracy determination (e.g. in the analysis module 202), for example using:

β=clamp(sampler·Bias+shaderOp·Bias,−maxSampler-
LodBias,maxSamplerLodBias)

and hence is provided as an input to the accuracy determination and $w_{\lambda_{min}}$ is the texture dimensions for the minimum LOD (and hence the corresponds to the highest resolution mipmap level).

Whilst the tests above relate to identifying whether catastrophic cancellation occurs, there is another criterion that is mentioned above that also prevents the use of the modified method of cube mapping. This is where the reference fragment and derived fragment do not map to the same face.

The tests described above, enable a determination to be made before cube mapping is performed (and where it is required) whether the error resulting from use of derivatives only (for the derived fragments) is bounded and hence whether cube mapping can be performed using a modified method that is computationally more efficient and hence requires less hardware and less power. Different combinations of tests may be used and as described above, some tests can be performed with less computation but may result in a more conservative answer, such that the modified cube mapping is not used in all situations where the error is bounded.

Figure 7:
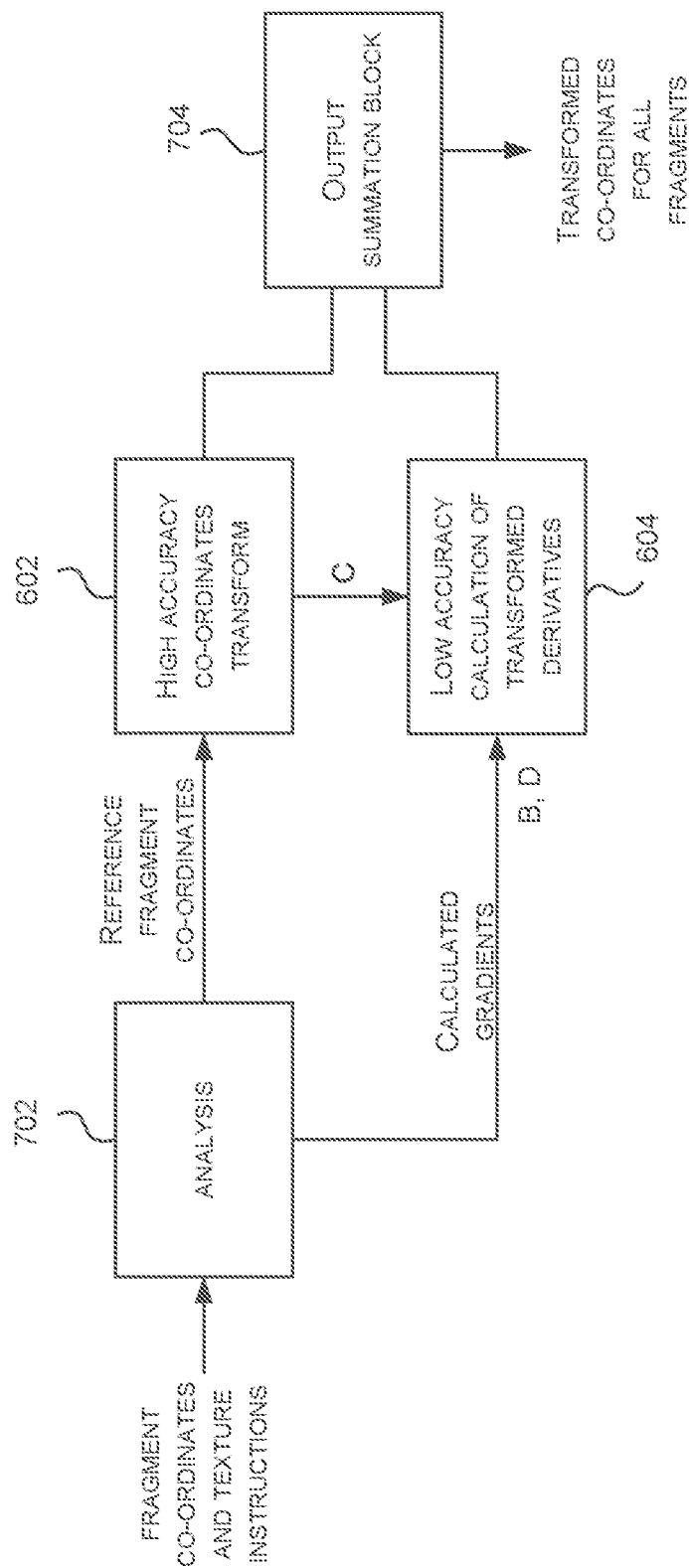
FIG. 7 is a schematic diagram showing a second example of improved cube mapping hardware.

Whilst the modified version of cube mapping is described above in the context of the method of FIG. 3, the modified version of cube mapping may alternatively be used separately from the method of FIG. 3. In particular the methods described may be used where cube map LOD gradients are supplied by the shader since these gradients are typically provided in direction space and so need to be mapped to the texture space like the gradients in the method of FIG. 3.

Where the modified version of cube mapping, as shown in FIG. 6, is used independently, an additional analysis hardware logic block 702 (similar to block 202) is included, as shown in FIG. 7 which performs the high accuracy calculation of the gradients where these are not provided by the shader (to provide the input values B and D) and to perform the tests described above to determine whether the fragments all map to the same face and identify when catastrophic cancellation may occur and hence when the modified version of cube mapping cannot be used. In addition, if downstream processing (e.g. LOD computation) expects the output of the cube mapping to be transformed coordinates for all input fragments, there may be a further hardware logic block 704 that adds the calculated derivatives to the transformed coordinates for the reference fragments to generate the transformed coordinates for the derived fragments. In the event that the analysis block 702 determines that the conditions that guarantee that catastrophic cancellation cannot occur are not met (e.g. using one or more of the tests detailed above), then the modified version of cube mapping that relies upon use of derived fragments is not used. The hardware shown in FIG. 7 may still be used, by processing the coordinates all input fragments in the high accuracy coordinate transform block 602 and like with the method of FIG. 3, this may be performed at half-rate (e.g. 2 fragments per clock cycle rather than 4 fragments per clock cycle where the modified method is used). For the gradients (rather than the coordinates), lower accuracy results may be used (e.g. since the accuracy may be less critical if they are only used for the LOD calculation) or the gradients may be recomputed using the transformed coordinates, potentially reusing the hardware (if sufficiently accurate) that is used to map the gradients or a higher accuracy gradient transformation may be used. In the event that it is determined that the fragments do not all map to the same face, in a first cycle, all the fragments may be mapped to the same face (with the face being notionally extended in size so that all fragment vectors intersect with the face) in order to calculate gradients for use in the LOD calculations and then subsequent cycles may be used to map each fragment to their respective face and perform the coordinate transformation at full accuracy.

In some examples, the method of FIG. 3 may be used without the modified cube mapping method of FIG. 6. In such examples, the tests for catastrophic cancellation may be omitted (in block 302) and instead cube mapping is treated like other projections and result in a 'fast fail' leading to the address generation being performed over two clock cycles (in blocks 308-310). Alternatively, cube mapping may be performed at full accuracy and before block 302 in FIG. 3 (e.g. as part of the analysis in block 202 rather than in block 204), such that again the tests for catastrophic cancellation can be omitted (in block 302) but in this case, the use of cube mapping is not a 'fast fail' criteria. Instead, the output of the cube mapping operation are provided as inputs to the method of FIG. 3 (e.g. for use in blocks 304-310).

Figure 9:
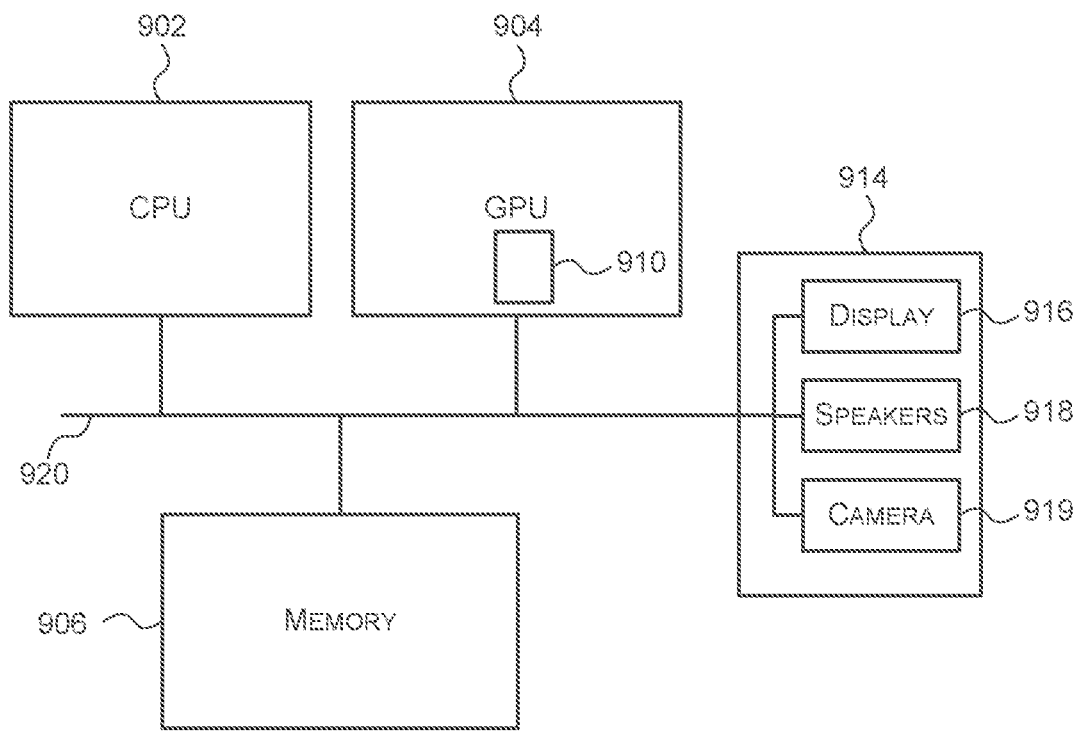
FIG. 9 shows a computer system in which a graphics processing system is implemented.

FIG. 9 shows a computer system in which the graphics processing systems described herein may be implemented. The computer system comprises a CPU 902, a GPU 904, a memory 906 and other devices 914, such as a display 916, speakers 918 and a camera 919. Texture hardware 910 that is arranged to implement the improved method of texture address generation and/or the improved method of cube mapping, as described above, is implemented within the GPU 904. The components of the computer system can communicate with each other via a communications bus 920.

The hardware of FIGS. 2, 6 and 7 are shown as comprising a number of functional blocks. This is schematic only and is not intended to define a strict division between different logic elements of such entities. Each functional block may be provided in any suitable manner. It is to be understood that intermediate values described herein as being formed by a hardware logic block need not be physically generated by the hardware logic block at any point and may merely represent logical values which conveniently describe the processing performed by the hardware logic block between its input and output.

The texture address generation units and cube mapping units described herein may be embodied in hardware on an integrated circuit. The texture address generation units described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a texture address generation unit and/or cube mapping unit configured to perform any of the methods described herein, or to manufacture a texture address generation unit and/or cube mapping unit comprising any apparatus described herein. An integrated circuit definition dataset may be, for example, an integrated circuit description.

Therefore, there may be provided a method of manufacturing, at an integrated circuit manufacturing system, a texture address generation unit and/or cube mapping unit as described herein. Furthermore, there may be provided an integrated circuit definition dataset that, when processed in an integrated circuit manufacturing system, causes the method of manufacturing a texture address generation unit and/or cube mapping unit to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a texture address generation unit and/or cube mapping unit will now be described with respect to FIG. 10.

Figure 10:
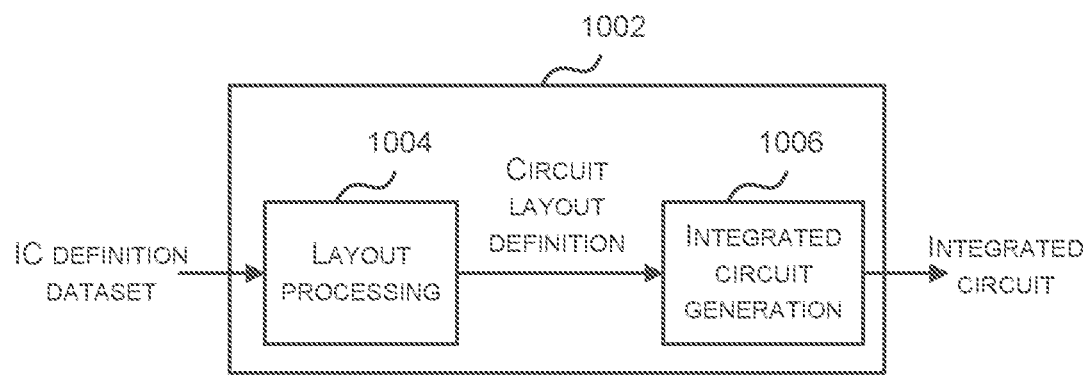
FIG. 10 shows an integrated circuit manufacturing system for generating an integrated circuit embodying a graphics processing system.

FIG. 10 shows an example of an integrated circuit (IC) manufacturing system 1002 which is configured to manufacture a texture address generation unit and/or cube mapping unit as described in any of the examples herein. In particular, the IC manufacturing system 1002 comprises a layout processing system 1004 and an integrated circuit generation system 1006. The IC manufacturing system 1002 is configured to receive an IC definition dataset (e.g. defining a texture address generation unit and/or cube mapping unit as described in any of the examples herein), process the IC definition dataset, and generate an IC according to the IC definition dataset (e.g. which embodies a texture address generation unit and/or cube mapping unit as described in any of the examples herein). The processing of the IC definition dataset configures the IC manufacturing system 1002 to manufacture an integrated circuit embodying a texture address generation unit and/or cube mapping unit as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a texture address generation unit and/or cube mapping unit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 10 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 10, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget."

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

A first further example provides a method of texture address generation, the method comprising: receiving fragment coordinates for an input block of fragments and texture instructions for the fragments; calculating gradients for at least one pair of fragments from the input block and determining, based on the calculated gradients, whether a first mode of texture address generation or a second mode of texture address generation is to be used, wherein the first mode of texture address generation performs calculations at a first precision for a subset of the fragments and calculations for remaining fragments at a second, lower, precision and the second mode of texture address generation performs calculations for all fragments at the first precision; and using the determined mode and the calculated gradients to perform texture address generation, wherein if the second mode is used and more than half of the fragments in the input block are valid, the texture address generation is performed over two clock cycles.

In the first mode of texture address generation, fragments in the subset may be reference fragments and remaining fragments may be derived fragments and the lower precision calculations for a derived fragment may be performed relative to one of the reference fragments.

Using the determined mode and the calculated gradients to perform texture address generation may comprise, in response to determining that the first mode of texture address generation is to be used: performing texture address generation for the reference fragments at the first precision; and performing relative texture address generation for the derived fragments at the second precision; and outputting indices for one or more patches of texels, mipmap level data for each patch of texels and blending weights for each valid fragment in the input block.

Performing relative address generation for a derived fragment at the second precision may comprise performing address generation relative to a corresponding reference fragment.

Outputting indices for one or more patches of texels, mipmap level data for each patch of texels and blending weights for each valid fragment in the input block may comprise: for each valid reference fragment, outputting indices for one or more patches of texels, mipmap level data for each patch of texels and blending weights; and for each valid derived fragment, outputting blending weights.

The method may further comprise: in response to determining, as part of performing relative address generation for a derived fragment, that the texels for the derived fragment fall outside the patch of texels for the corresponding reference fragment, generating, in a next clock cycle, one or more texel patches for the remaining fragment.

Using the determined mode and the calculated gradients to perform texture address generation may comprise, in response to determining that the second mode of texture address generation is to be used: in a first clock cycle, performing address generation for the subset of the fragments at the first precision; in a second clock cycle, performing address generation for each of the remaining fragments at the first precision; and outputting indices for one or more patches of texels, mipmap level data for each patch of texels and blending weights for each valid fragment in the input block.

Outputting indices for one or more patches of texels, mipmap level data for each patch of texels and blending weights for each valid fragment in the input block may comprise: for each valid fragment in input block, outputting indices for one or more patches of texels, mipmap level data for each patch of texels and blending weights.

Determining, based on the calculated gradients, whether a first mode of texture address generation or a second mode of texture address generation is to be used may comprise: identifying a number of valid fragments in the input block; determining whether one or more pairs of valid fragments in the input block can be replaced by a reference fragment and a derived fragment; and based on the determination and the number of valid fragments, selecting the first mode of texture address generation or the second mode of texture address generation.

The method may comprise: in response to identifying four valid fragments and determining that two pairs of valid fragments can be replaced, selecting the first mode; and in response to identifying four valid fragments and determining that less than two pairs of valid fragments can be replaced, selecting the second mode.

The method may comprise: in response to identifying only three valid fragments and determining that no pairs of valid fragments can be replaced or a trailing diagonal pair of fragments cannot be replaced, selecting the second mode; otherwise, in response to identifying only three valid fragments, selecting the first mode.

The method may comprise: in response to identifying only two valid fragments, selecting the first mode.

The method may comprise: in response to identifying more than two valid fragments and that the texture instructions indicate use of anisotropic filtering, selecting the second mode.

The method may comprise: in response to identifying more than two valid fragments and that the texture instructions indicate use of use of a projection operation, selecting the second mode.

Determining that a pair of valid fragments in the input block can be replaced by a reference fragment and a derived fragment may comprise one or more of: (i) determining that a step between texels for the pair of valid fragments is not greater than a pre-defined threshold; (ii) determining that a shader-supplied level of detail bias is not less than a bias threshold, where that bias threshold may be set to −1; (iii) determining that, after rounding, the pair of fragments have a common per-fragment shader-supplied level of detail bias; (iv) determining that a level of detail implied by a largest of the gradients of the pair of valid fragments is not larger than a maximum level of detail; (v) determining that level of detail parameters of the pair of valid fragments indicate that both fragments use a common mipmap level; (vi) determining that the pair of valid fragments map to a common face of a cube map; and (vii) determining that performing the calculations at the second precision for the derived fragment relative to a corresponding reference fragment results in a relative error that does not exceed a predefined error threshold.

A second further example provides a texture address generation unit comprising: an input for receiving fragment coordinates for an input block of fragments and texture instructions for the fragments; an analysis hardware logic block arranged to calculate gradients for at least one pair of fragments from the input block of fragments and determine, based on the calculated gradients, whether a first mode of texture address generation or a second mode of texture address generation is to be used, wherein the first mode of texture address generation performs calculations at a first precision for a subset of the fragments and calculations for remaining fragments at a second, lower, precision and the second mode of texture address generation performs calculations for all fragments at the first precision; and at least one further hardware logic block arranged to use the determined mode and the calculated gradients to perform texture address generation, wherein if the second mode is used and more than half of the fragments in the input block are valid, the texture address generation is performed over two clock cycles.

The at least one further hardware logic block may comprise: a transform and set-up hardware logic block arranged to transform coordinates and gradient vectors, to perform level of detail calculations and determine global filter parameters; and a sequence and iterate hardware logic block arranged to determine a sequence of filter operations and determine blending weights and to output indices for one or more patches of texels, mipmap level data for each patch of texels and blending weights for each valid fragment in the input block.

A third further example provides a method of cube mapping, the method comprising: receiving fragment coordinates for an input block of fragments and texture instructions for the fragments; determining, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision; and using the determined mode and the gradients to perform cube mapping, wherein if the second mode is used and more than half of the fragments in the input block are valid, the cube mapping is performed over two clock cycles.

The method may further comprise receiving, with the fragment coordinates for the input block of fragments, shader supplied gradients.

The method may further comprise, prior to determining whether a first mode of cube mapping or a second mode of cube mapping is to be used: calculating gradients of the input block of fragments at the first precision.

In the first mode of cube mapping, fragments in the subset may be reference fragments and remaining fragments may be derived fragments and the lower precision calculations for a derived fragment may be performed relative to one of the reference fragments.

Using the determined mode and the gradients to perform cube mapping may comprise, in response to determining that the first mode of cube mapping is to be used: performing coordinate transforms at the first precision for the reference fragments; and performing gradient transforms at the second precision for the derived fragments.

Using the determined mode and the gradients to perform cube mapping may further comprise, in response to determining that the first mode of cube mapping is to be used: adding the transformed gradients to the transformed coordinates for the reference fragments to generate the transformed coordinates for the derived fragments.

Determining, based on gradients of the input block of fragments, whether a first mode of cube mapping or a second mode of cube mapping is to be used may comprise: determining whether all the fragments in the input block map to a common face of the cube; and determining whether performing the calculations at the second precision for remaining fragments relative to fragments in the subset of fragments results in a relative error that does not exceed a predefined error threshold, wherein the first mode is selected for use in response to determining both that all the fragments in the input block map to a common face and that the relative error does not exceed the predefined error threshold.

Determining whether performing the calculations at the second precision for remaining fragments relative to fragments in the subset of fragments results in a relative error that does not exceed a predefined error threshold may comprise: determining whether cancellation of terms may occur when performing gradient transforms at the second precision for the derived fragments as part of cube mapping based on exponents of the gradients of the input block of fragments.

Determining whether performing the calculations at the second precision for remaining fragments relative to fragments in the subset of fragments results in a relative error that does not exceed a predefined error threshold may comprise: determining whether cancellation of terms may occur when performing gradient transforms at the second precision for the derived fragments as part of cube mapping based on signs of the gradients of the input block of fragments.

Determining whether performing the calculations at the second precision for remaining fragments relative to fragments in the subset of fragments results in a relative error that does not exceed a predefined error threshold may comprise: determining whether cancellation of terms may occur when performing gradient transforms at the second precision for the derived fragments as part of cube mapping based on a comparison the gradients of the input block of fragments.

The comparison may be given by: $|B|>2 \cdot |D| \Rightarrow \varepsilon < 3\varepsilon_0 \cdot 2^{-bias}$ bias where B and D are gradients of the input block of fragments, $\varepsilon$ is the relative error, $\varepsilon_0$ is a pre-defined error threshold and bias is a level of detail bias included in the texture instructions.

A fourth further example provides cube mapping hardware logic unit comprising: an input for receiving fragment coordinates for an input block of fragments and texture instructions for the fragments; an analysis hardware logic block arranged to determine, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision; and one or more further hardware logic blocks arranged to perform cube mapping using the determined mode and the gradients, wherein if the second mode is used and more than half of the fragments in the input block are valid, the cube mapping is performed over two clock cycles.

The input may be further for receiving, with the fragment coordinates for the input block of fragments, shader supplied gradients.

The analysis hardware logic block may be further arranged to calculate gradients of the input block of fragments at the first precision.

In the first mode of cube mapping, fragments in the subset may be reference fragments and remaining fragments may be derived fragments and the lower precision calculations for a derived fragment may be performed relative to one of the reference fragments.

The one or more further hardware logic blocks may comprise: a coordinate transform hardware logic block arranged to perform coordinate transforms at the first precision for the reference fragments; and a derivate transform hardware logic block arranged to perform gradient transforms at the second precision for the derived fragments.

The one or more further hardware logic blocks may further comprise: an output summation hardware logic block arranged to add the transformed gradients to the transformed coordinates for the reference fragments to generate the transformed coordinates for the derived fragments.

What is claimed is:

1. A method of cube mapping, the method comprising:
    receiving fragment coordinates for an input block of fragments and texture instructions for the fragments;
    determining, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision, so as to obtain a determined mode; and
    using the determined mode and the gradients to perform cube mapping, wherein if the second mode is used and more than half of the fragments in the input block are valid, the cube mapping is performed over two clock cycles.

2. The method according to claim 1, further comprising receiving, with the fragment coordinates for the input block of fragments, shader supplied gradients.

3. The method according to claim 1, further comprising, prior to determining whether a first mode of cube mapping or a second mode of cube mapping is to be used:
    calculating the gradients of the input block of fragments at the first precision.

4. The method according to claim 1, wherein in the first mode of cube mapping, fragments in the subset are reference fragments and remaining fragments are derived fragments and the calculations for a derived fragment at the second, lower precision are performed relative to one of the reference fragments.

5. The method according to claim 4, wherein using the determined mode and the gradients to perform cube mapping comprises, in response to determining that the first mode of cube mapping is to be used:
   performing coordinate transforms at the first precision for the reference fragments so as to obtain transformed coordinates for the reference fragments; and
   performing gradient transforms at the second, lower precision for the derived fragments so as to obtain transformed gradients.

6. The method according to claim 5, wherein using the determined mode and the gradients to perform cube mapping further comprises, in response to determining that the first mode of cube mapping is to be used:
   adding the transformed gradients to the transformed coordinates for the reference fragments to generate the transformed coordinates for the derived fragments.

7. The method according to claim 4, wherein determining, based on the gradients of the input block of fragments, whether the first mode of cube mapping or the second mode of cube mapping is to be used comprises:
   determining whether all the fragments in the input block map to a common face of the cube; and
   determining whether performing the calculations at the second, lower precision for remaining fragments relative to fragments in the subset of fragments results in a relative error that does not exceed a predefined error threshold,
   wherein the first mode is selected for use in response to determining both that all the fragments in the input block map to a common face and that the relative error does not exceed the predefined error threshold.

8. The method according to claim 7, wherein determining whether performing the calculations at the second, lower precision for remaining fragments relative to fragments in the subset of fragments results in the relative error that does not exceed the predefined error threshold comprises:
   determining whether cancellation of terms may occur when performing gradient transforms at the second precision for the derived fragments as part of cube mapping based on exponents of the gradients of the input block of fragments.

9. The method according to claim 7, wherein determining whether performing the calculations at the second, lower precision for remaining fragments relative to fragments in the subset of fragments results in the relative error that does not exceed the predefined error threshold comprises:
   determining whether cancellation of terms may occur when performing gradient transforms at the second precision for the derived fragments as part of cube mapping based on signs of the gradients of the input block of fragments.

10. The method according to claim 7, wherein determining whether performing the calculations at the second, lower precision for remaining fragments relative to fragments in the subset of fragments results in the relative error that does not exceed the predefined error threshold comprises:
   determining whether cancellation of terms may occur when performing gradient transforms at the second precision for the derived fragments as part of cube mapping based on a comparison the gradients of the input block of fragments.

11. The method according to claim 10, wherein the comparison is given by:

$$|B| > 2 \cdot |D| \Rightarrow \varepsilon < 3\varepsilon_0 \cdot 2^{-bias}$$

where B and D are gradients of the input block of fragments, $\varepsilon$ is the relative error, $\varepsilon_0$ is the pre-defined error threshold and bias is a level of detail bias included in the texture instructions.

12. A cube mapping hardware logic unit comprising:
   an input for receiving fragment coordinates for an input block of fragments and texture instructions for the fragments;
   an analysis hardware logic block arranged to determine, based on gradients of the input block of fragments, whether a first mode of cube mapping or a second mode of cube mapping is to be used, wherein the first mode of cube mapping performs calculations at a first precision for a subset of the fragments and calculations for remaining fragments at a second, lower, precision and the second mode of cube mapping performs calculations for all fragments at the first precision, so as to obtain a determined mode; and
   one or more further hardware logic blocks arranged to perform cube mapping using the determined mode and the gradients, wherein if the second mode is used and more than half of the fragments in the input block are valid, the cube mapping is performed over two clock cycles.

13. The cube mapping hardware logic unit according to claim 12, wherein the input is further for receiving, with the fragment coordinates for the input block of fragments, shader supplied gradients.

14. The cube mapping hardware logic unit according to claim 12, wherein the analysis hardware logic block is further arranged to calculate the gradients of the input block of fragments at the first precision.

15. The cube mapping hardware logic unit according to claim 12, wherein in the first mode of cube mapping, fragments in the subset are reference fragments and remaining fragments are derived fragments and the calculations for a derived fragment at the second, lower precision are performed relative to one of the reference fragments.

16. The cube mapping hardware logic unit according to claim 15, wherein the one or more further hardware logic blocks comprise:
   a coordinate transform hardware logic block arranged to perform coordinate transforms at the first precision for the reference fragments so as to obtain transformed coordinates for the reference fragments; and
   a derivate transform hardware logic block arranged to perform gradient transforms at the second, lower precision for the derived fragments so as to obtain transformed gradients.

17. The cube mapping hardware logic unit according to claim 16, wherein the one or more further hardware logic blocks further comprise:
   an output summation hardware logic block arranged to add the transformed gradients to the transformed coordinates for the reference fragments to generate the transformed coordinates for the derived fragments.

18. A texture address generation unit comprising a cube mapping hardware logic unit as set forth in claim 12.

19. A non-transitory computer readable storage medium having stored thereon an integrated circuit definition dataset that, when processed in an integrated circuit manufacturing system, configures the integrated circuit manufacturing system to manufacture a graphics processing system comprising cube mapping hardware logic as set forth in claim 12.

20. An integrated circuit manufacturing system comprising:

a non-transitory computer readable storage medium having stored thereon a computer readable dataset description of an integrated circuit that describes a graphics processing system comprising cube mapping hardware logic as set forth in claim 12;

a layout processing system configured to process the integrated circuit description so as to generate a circuit layout description of an integrated circuit embodying the graphics processing system; and an integrated circuit generation system configured to manufacture the graphics processing system according to the circuit layout description.

\* \* \* \* \*